United States Patent
Kaneda et al.

(10) Patent No.: US 10,894,519 B2
(45) Date of Patent: Jan. 19, 2021

(54) VEHICLE SWITCH CONTROL DEVICE AND SWITCH STATE DETECTION METHOD

(71) Applicant: ROHM CO., LTD., Kyoto (JP)

(72) Inventors: Yuji Kaneda, Kyoto (JP); Yuzo Mizushima, Kyoto (JP); Shogo Takamura, Kyoto (JP); Isao Niwa, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 394 days.

(21) Appl. No.: 16/063,738

(22) PCT Filed: Dec. 2, 2016

(86) PCT No.: PCT/JP2016/085874
§ 371 (c)(1),
(2) Date: Jun. 19, 2018

(87) PCT Pub. No.: WO2017/115610
PCT Pub. Date: Jul. 6, 2017

(65) Prior Publication Data
US 2020/0269780 A1    Aug. 27, 2020

(30) Foreign Application Priority Data

Dec. 28, 2015    (JP) ................ 2015-255816

(51) Int. Cl.
*B60R 16/02* (2006.01)
*B60R 16/023* (2006.01)
*G01R 31/327* (2006.01)

(52) U.S. Cl.
CPC ...... *B60R 16/0231* (2013.01); *G01R 31/3277* (2013.01)

(58) Field of Classification Search
CPC .......... H01L 21/32051; H01L 23/5226; G01R 31/2853
See application file for complete search history.

(56) References Cited

U.S. PATENT DOCUMENTS

| 5,483,517 A | 1/1996 | Kurata et al. |
| 5,633,537 A | 5/1997 | Kurata et al. |

(Continued)

FOREIGN PATENT DOCUMENTS

| JP | H05211432 A | 8/1993 |
| JP | H07-038566 A | 2/1995 |

(Continued)

OTHER PUBLICATIONS

Japanese Office Action dated May 14, 2019, with English translation, 80 pages.

(Continued)

*Primary Examiner* — Alvaro E Fortich
(74) *Attorney, Agent, or Firm* — Fish & Richardson P.C.

(57) ABSTRACT

Provided is an integrated circuit (41) that operates in normal mode or sleep mode corresponding to the on/off state of a vehicle engine. On the basis of information of setting data information stored in an internal register (42) and information of the on/off state of the vehicle engine from an MPU (50), the integrated circuit (41) generates monitoring signals (INZ0 to INZ7), monitoring signals (INA0 to INA7), and monitoring signals (INB0 to INB5). These monitoring signals enables to monitor states of a head light switch (11), a door switch (12), and a window switch (13). As the switch state monitoring method, intermittent operation or constant monitoring operation is performed.

10 Claims, 21 Drawing Sheets

(56) References Cited

U.S. PATENT DOCUMENTS

| | | | |
|---|---|---|---|
| 2002/0118502 A1 | 8/2002 | Hiroo et al. | |
| 2003/0115940 A1* | 6/2003 | Miyaki | F02D 29/02 73/114.01 |
| 2003/0229403 A1 | 12/2003 | Nakazawa et al. | |
| 2007/0229306 A1 | 10/2007 | Otterbach et al. | |
| 2009/0102412 A1* | 4/2009 | Hwang | H02P 1/30 318/707 |
| 2014/0300208 A1 | 10/2014 | Yamamoto et al. | |
| 2016/0118885 A1* | 4/2016 | Abdoulin | H02M 7/5387 323/271 |

FOREIGN PATENT DOCUMENTS

| | | |
|---|---|---|
| JP | H07-038966 A | 2/1995 |
| JP | H08-186754 A | 7/1996 |
| JP | 2002-063150 A | 2/2002 |
| JP | 2002261594 A | 9/2002 |
| JP | 2004-014225 A | 1/2004 |
| JP | 2006-522380 A | 9/2006 |
| JP | 2009-132366 A | 6/2009 |
| JP | 2010-140364 A | 6/2010 |
| JP | 2011-002942 A | 1/2011 |
| JP | 2011-070309 A | 4/2011 |
| JP | 4762425 B | 6/2011 |
| JP | 2011-178237 A | 9/2011 |
| JP | 2014-203773 A | 10/2014 |
| JP | 2014213675 A | 11/2014 |

OTHER PUBLICATIONS

Japan Patent Office, International Search Report for PCT/JP2016/085874 dated Feb. 21, 2017, with English translation.

Japanese Patent Office; Notice of Reasons for Refusal mailed in counterpart Japanese Patent Application No. 2017-558905 (dated Sep. 3, 2019) with English-language translation.

* cited by examiner

FIG.10A

| COMMAND 0"L", 1"H", x:Don't care | | | REGISTER ADDRESS | | | | | | | | SETTING DATA | | | | | | | | |
|---|---|---|---|---|---|---|---|---|---|---|---|---|---|---|---|---|---|---|---|
| | | 39 | 38 | 37 | 36 | 35 | 34 | 33 | 32 | 31 | 30 | 29 | 28 | 27 | 26 | 25 | 24 | | |
| NORMAL MODE SETTING | FMR | 0 | 1 | 0 | 0 | 1 | 0 | 1 | 1 | FSQ | FSQ B | FSQ A | FSQ Z | FIT B2 | FIT B1 | FITB 0 | FIT A2 | | |

NORMAL MODE SETTING COMMAND

| | | | | | | SETTING DATA | | | | | | | | | CRC |
|---|---|---|---|---|---|---|---|---|---|---|---|---|---|---|---|
| 23 | 22 | 21 | 20 | 19 | 18 | 17 | 16 | 15 | 14 | 13 | 12 | 11 | 10 | 9 | 8 | 7-0 |
| FITA 1 | FITA 0 | FITZ 2 | FITZ 1 | FITZ 0 | SVW 1 | SVW 0 | x | x | x | x | x | x | x | x | x | CRC |

FIG.10B

```
FIT*[2:0](*:B,A,Z)[Default:000]NORMAL MODE MONITORING
PERIOD SETTING
     "000":ALWAYS MONITORING   "100":20ms
     "001":2.5ms                "101":30ms
     "010":5ms                  "110":40ms
     "011":10ms                 "111":50ms
```

FIG.10C

```
SVW[1:0][Default:01]STROBE TIME SETTING

COMMAND 0"L", 1"H", x:Don't care

SLEEP MODE SETTING COMMAND

| | COMMAND | REGISTER ADDRESS | | | | | | | SETTING DATA | | | | | | | |
|---|---|---|---|---|---|---|---|---|---|---|---|---|---|---|---|---|
| | 39 | 38 | 37 | 36 | 35 | 34 | 33 | 32 | 31 | 30 | 29 | 28 | 27 | 26 | 25 | 24 |
| SLEEP MODE SETTING | SMR | 1 | 0 | 0 | 1 | 1 | 0 | 0 | SSQ | SSQ B | SSQ A | SSQ Z | SIT B2 | SIT B1 | SITB 0 | SIT A2 |

| | SETTING DATA | | | | | | | | | | | | | | CRC |
|---|---|---|---|---|---|---|---|---|---|---|---|---|---|---|---|
| 23 | 22 | 21 | 20 | 19 | 18 | 17 | 16 | 15 | 14 | 13 | 12 | 11 | 10 | 9 | 8 | 7-0 |
| SITA 1 | SITA 0 | SITZ 2 | SITZ 1 | SITZ 0 | x | x | x | x | x | x | x | x | x | x | x | CRC |

FIG.11B

SIT*[2:0](*:B,A,Z)[Default:111] SLEEP MODE MONITORING PERIOD SETTING
"000": ALWAYS MONITORING
"001":2.5ms
"010":5ms
"011":10ms
"100":20ms
"101":30ms
"110":40ms
"111":50ms

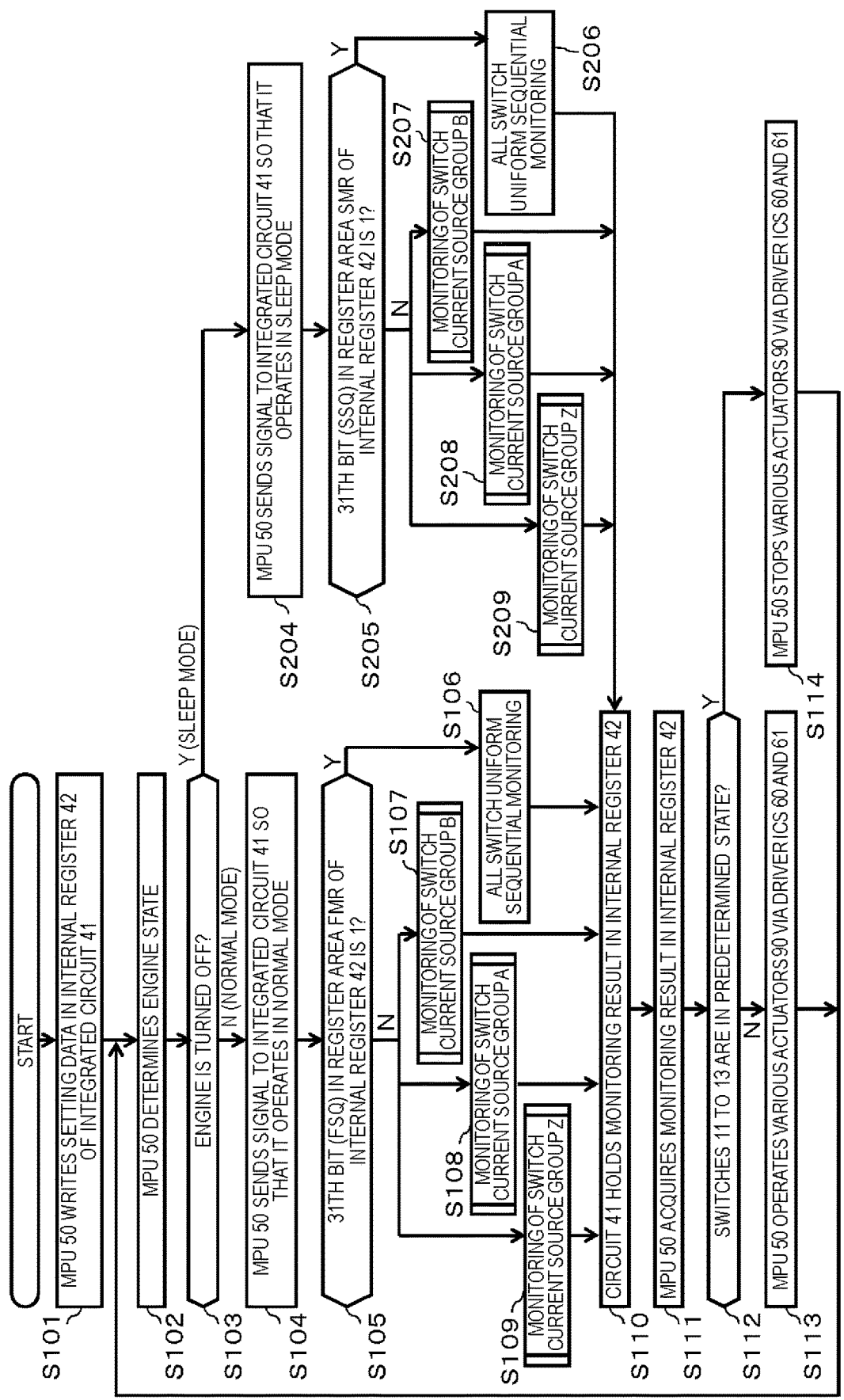

VEHICLE SWITCH CONTROL DEVICE AND SWITCH STATE DETECTION METHOD

TECHNICAL FIELD

The present invention relates to a vehicle switch control device and a switch state detection method used in a vehicle.

BACKGROUND ART

Conventionally, a body control module (BCM) is used in a vehicle, for purposes of security system control, door lock control, and power window control. A well-known electronic control unit (ECU) is used also for the BCM. The ECU has a function for detecting states of a plurality of switches provided to the vehicle using a processing unit such as a central processing unit (CPU) or a micro processing unit (MPU) inside the ECU, so as to perform processing corresponding to a user's operation. The ECU is required to detect states of the switches provided to the vehicle independently of operation of a vehicle engine. Therefore it is desired to reduce power consumption of a battery by the ECU.

Accordingly, when the vehicle engine is stopped, the processing unit such as a CPU or an MPU in the ECU is switched to a sleep state, and the switch state detection is performed by a switch state detection device different from the processing unit such as a CPU or an MPU. Thus, power consumption of the battery can be reduced.

FIG. 13 is a diagram that simply illustrates a conventional method for controlling vehicle switches, which is known to the inventor. As illustrated in FIG. 13, the method for controlling vehicle switches has a sleep mode when the vehicle engine is turned off and a normal mode when the vehicle engine is turned on. In the sleep mode, a monitoring signal is output intermittently to the vehicle switches. In other words, in the sleep mode, current is controlled so that each vehicle switch is intermittently supplied with current. In this way, current consumption is reduced when the engine is turned off. In addition, in a conventional vehicle, it is not necessary to reduce power consumption when the engine is turned on, because the number of electronic devices that are used is small. Therefore, in the normal mode, the monitoring signal is always output to the vehicle switches. In other words, in the normal mode, current is controlled so that the vehicle switches are always supplied with current. However, in recent years, the number of electronic devices to be used in a vehicle is increased, and it is necessary to reduce power consumption regardless of on or off of the engine. Accordingly, there are disclosed various methods for reducing power consumption.

LIST OF CITATIONS

Patent Literature

Patent Document 1: JP-A-2009-132366
Patent Document 2: JP-A-2011-178237
Patent Document 3: Japanese Patent No. 4762425
Patent Document 4: JP-A-2014-203773

SUMMARY OF THE INVENTION

Technical Problem

In the conventional method for controlling switches in a vehicle illustrated in FIG. 13, current consumption is increased when the vehicle engine is turned on.

As to the vehicle switch control device described in Patent Document 1, there is no indication about a method for controlling current flowing in each switch in the vehicle depending on on/off state of the engine.

Also as to the signal input device and the in-vehicle processing system described in Patent Document 2, there is no indication about a method for controlling current flowing in each switch in the vehicle depending on on/off state of the engine.

Also as to the electronic control device described in Patent Document 3, there is no indication about a method for controlling current flowing in each switch in the vehicle depending on on/off state of the engine.

As to the switch state detection circuit and the switching system described in Patent Document 4, there is no indication about a method for controlling current flowing in each switch in the vehicle depending on on/off state of the engine.

Accordingly, it is an object of the present invention to provide a vehicle switch control device and a switch state detection method in which current consumption is reduced more, and noise is reduced more.

Means for Solving the Problem

A switch state detection circuit according to the present invention detects states of a plurality of switches in a vehicle including an engine. The switch state detection circuit according to the present invention includes a plurality of switch current sources corresponding to the plurality of switches, respectively, and an integrated circuit arranged to determine an on/off state of the engine, to operate in a normal mode in which the plurality of switch current sources are intermittently turned on so that the states of the plurality of switches are detected at a first period when the engine is determined to be turned on, and to operate in a sleep mode in which the plurality of switch current sources are intermittently turned on so that the states of the plurality of switches are detected at a second period when the engine is determined to be turned off.

In the switch state detection circuit according to the present invention, the second period may be longer than the first period.

The plurality of switch current sources may be divided into a plurality of switch current source groups. The integrated circuit may sequentially turn on the plurality of switch current sources in each switch current source group.

The integrated circuit may sequentially turn on the plurality of switch current sources.

The integrated circuit may further include a storage device in which information indicating the first and second periods can be written externally, and the integrated circuit may detect the states of the plurality of switches in the normal mode at the first period based on the information stored in the storage device, and may detect the states of the plurality of switches in the sleep mode at the second period based on the information stored in the storage device.

A switch state detection method according to the present invention is a method for detecting states of a plurality of switches in a vehicle including an engine, and the method includes the step of determining an on/off state of the engine. In addition, the switch state detection method according to the present invention includes the step of detecting the states of the plurality of switches at a first period by supplying currents from a plurality of switch current sources to the plurality of switches when the engine is determined to be turned on. Further, the switch state detection method according to the present invention includes the step of detecting the states of the plurality of switches at a second period by supplying currents from a plurality of switch current sources to the plurality of switches when the engine is determined to be turned off.

In the switch state detection method according to the present invention, the second period may be longer than the first period.

In the switch state detection method according to the present invention, the plurality of switch current sources may be divided into a plurality of switch current source groups, and the method may further include the step of determining whether or not to perform a sequential operation in which the plurality of switch current sources of the plurality of switch current source groups are sequentially turned on in the normal mode and in the sleep mode. In addition, the method may further include the step of sequentially detecting the states of the plurality of switches at the first period or the second period, by sequentially turning on the plurality of switch current sources of the plurality of switch current source groups, so as to sequentially supply currents from the current sources to the plurality of switches, when it is determined to perform the sequential operation.

The switch state detection method according to the present invention may further include the step of determining whether or not to perform an all switch uniform sequential operation in which the plurality of switch current sources are sequentially turned on in the normal mode and in the sleep mode. In addition, the method may further include the step of sequentially detecting the states of the plurality of switches at the first period or the second period, by sequentially turning on the plurality of switch current sources, so as to sequentially supply currents from the current sources to the plurality of switches, when it is determined to perform the all switch uniform sequential operation.

A computer program according to the present invention is what causes a computer to perform the steps.

Advantageous Effects of the Invention

According to the present invention, a vehicle switch control device and a switch state detection method can be provided, which can reduce current consumption more and can reduce noise more.

BRIEF DESCRIPTION OF DRAWINGS

FIG. 10A is a diagram illustrating a normal mode setting command in the embodiment of the present invention.

FIG. 10B is a diagram illustrating monitoring period setting for the normal mode setting command in FIG. 10A.

FIG. 10C is a diagram illustrating strobe time setting for the normal mode setting command in FIG. 10A.

FIG. 11A is a diagram illustrating a sleep mode setting command in the embodiment of the present invention.

FIG. 11B is a diagram illustrating monitoring period setting for the sleep mode setting command in FIG. 11A.

FIG. 12 is a flowchart illustrating process content related to the normal mode and the sleep mode in the embodiment of the present invention.

DESCRIPTION OF EMBODIMENTS

In all diagrams for describing the following embodiment, elements having the same function are denoted by the same numeral or symbol, and overlapping description thereof is omitted. The embodiment of the present invention is described below with reference to the drawings.

Figure 1:
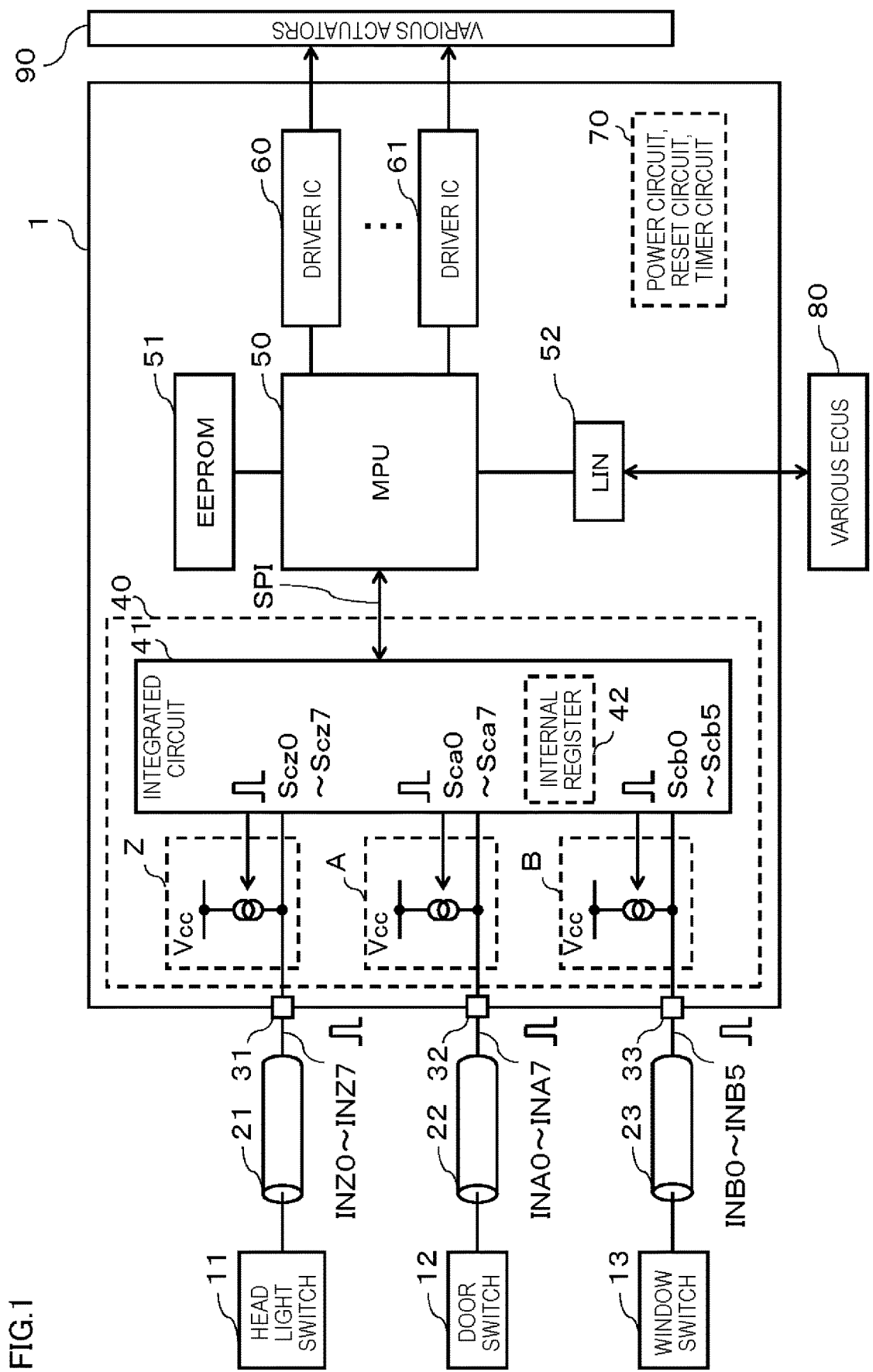
FIG. 1 is a block diagram illustrating a structure of a switch detection circuit and its vicinity in an embodiment of the present invention.

FIG. 1 is a block diagram illustrating a structure of a vehicle switch control device and its vicinity in the embodiment of the present invention.

As illustrated in FIG. 1, a switch state detection circuit of the embodiment of the present invention is used for a vehicle, for example, and the vehicle includes an ECU 1, a head light switch 11, a door switch 12, a window switch 13, wire harnesses 21 to 23, various ECUs 80, and various actuators 90.

Note that the head light switch 11, the door switch 12, and the window switch 13 may include a switch that detects a retracted state of a door mirror, a switch that detects whether or not a winker is turned on, and other switches. In addition, the head light switch 11, the door switch 12, and the window switch 13 are switches having mechanical contacts, for example. As the actuator 90, there are a window motor, a door lock motor, and the like.

The ECU 1 includes a switch state detection circuit 40, a micro processing unit (MPU) 50, an electrically erasable programmable read only memory (EEPROM) 51, a driver IC 60, a driver IC 61, and other circuits 70. The other circuits 70 include a power circuit, a reset circuit, a timer circuit, and the like. In addition, the ECU 1 is provided with external terminals 31 to 33.

The switch state detection circuit 40 includes a switch current source group Z that is used for determining a switch state, a switch current source group A that is used for determining a switch state, a switch current source group B that is used for determining a switch state, and an integrated circuit 41.

Figure 2:
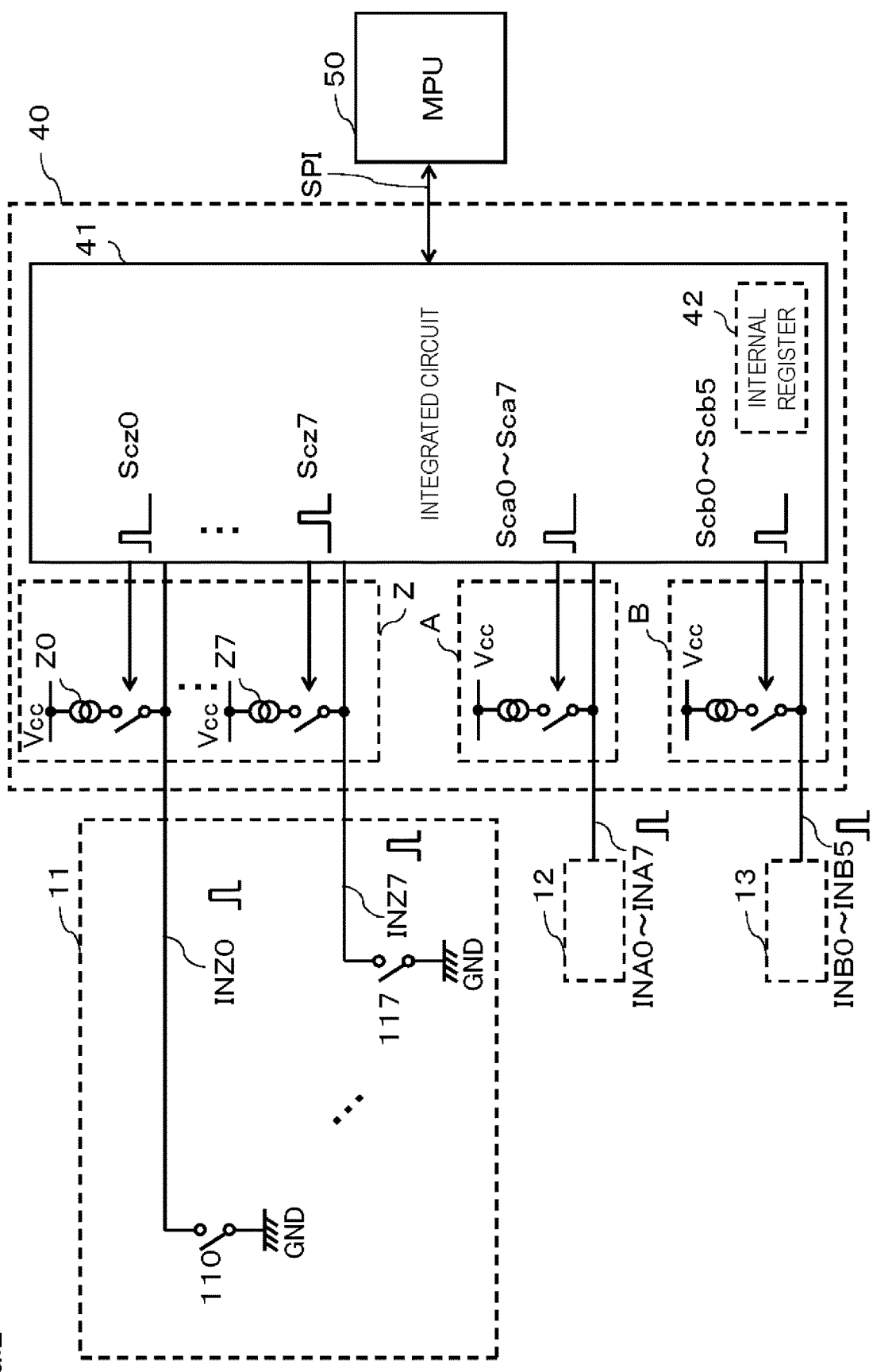
FIG. 2 is a schematic circuit diagram illustrating the switch detection circuit of the embodiment of the present invention.

As illustrated in FIG. 2 described later, the switch current source group Z is constituted of eight switch current sources Z0 to Z7. The switch current source group A is constituted of eight switch current sources A0 to A7 described later. The switch current source group B is constituted of six switch current sources B0 to B5 described later.

The integrated circuit 41 is, for example, an application specific integrated circuit (ASIC) including a programmable digital controller. Circuit design of the integrated circuit 41 is performed by using hardware description language (HDL), for example, but this is not a limitation. Specifically, very high speed integrated circuit hardware description language (VHDL) that is well known, Verilog hardware description language (Verilog), or the like is used. The integrated circuit 41 includes an internal oscillator, an analog-to-digital converter, and a comparator, which are not illustrated, and further includes an illustrated internal register 42, and the like.

When the ECU 1 is activated, the MPU 50 writes setting data in the internal register 42 of the integrated circuit 41, which is operation setting of the integrated circuit 41 stored in the EEPROM 51 by serial peripheral interface (SPI) communication, inter integrated circuit (IIC) communication, microwire communication, or the like, for example. The SPI communication is one of synchronous serial communications. Data are written in the internal register 42, which include setting data for the switch current source group Z, the switch current source group A, and the switch current source group B, when the vehicle engine is turned on, as well as setting data for the switch current source group Z, the switch current source group A, and the switch current source group B, when the vehicle engine is turned off. Note that the EEPROM 51 stores various information including various programs, which can be electrically rewritten. In this way, the MPU 50 controls operation of the switch state detection circuit 40.

In addition, the MPU 50 performs protocol communication with the various ECUs 80 via a local interconnect network (LIN) 52. In this way, the MPU 50 acquires on/off state information of the vehicle engine. After that, the MPU 50 sends the on/off state information of the vehicle engine to the integrated circuit 41 by SPI communication. Note that a controller area network (CAN) may be used instead of the LIN 52.

The integrated circuit 41 operates based on the setting data when vehicle engine is turned on or the setting data when the vehicle engine is turned off, stored in the internal register 42, based on the on/off state information of the vehicle engine from the MPU 50.

Specifically, the integrated circuit 41 generates control signals Scz0 to Scz7 based on setting data information stored in the internal register 42 and the on/off state information of the vehicle engine from the MPU 50. The control signals Scz0 to Scz7 control on/off states of the switch current sources Z0 to Z7 (not shown) of the switch current source group Z. Note that the control signals Scz0 to Scz7 may have predetermined time lags, respectively.

The integrated circuit 41 generates control signals Sca0 to Sca7 based on the setting data information stored in the internal register 42 and the on/off state information of the vehicle engine from the MPU 50. The control signals Sca0 to Sca7 control on/off states of the switch current sources A0 to A7 (not shown) of the switch current source group A. The control signals Sca0 to Sca7 may have predetermined time lags, respectively.

The integrated circuit 41 generates control signals Scb0 to Scb5 based on the setting data information stored in the internal register 42 and the on/off state information of the vehicle engine from the MPU 50. The control signals Scb0 to Scb5 control on/off states of the switch current sources B0 to B5 (not shown) of the switch current source group B. The control signals Scb0 to Scb5 may have predetermined time lags, respectively.

The integrated circuit 41 switches on/off states of the switch current sources Z0 to Z7 (FIG. 2) of the switch current source group Z by the control signals Scz0 to Scz7, and generates monitoring signals INZ0 to INZ7 as current signals. The integrated circuit 41 determines whether or not the monitoring signals INZ0 to INZ7 flow to the head light switch 11 via the terminal 31 and the wire harness 21, so that the integrated circuit 41 determines a state of the head light switch 11. The integrated circuit 41 performs an intermittent operation for intermittently monitoring states of the switches or a constant monitoring operation for constantly monitoring states of the switches, as a switch state monitoring method.

The integrated circuit 41 switches on/off states of the switch current sources A0 to A7 of the switch current source group A by the control signals Sca0 to Sca7, and generates monitoring signals INA0 to INA7 as current signals. The integrated circuit 41 determines whether or not the monitoring signals INA0 to INA7 flow to the door switch 12 via the terminal 32 and the wire harness 22, so that the integrated circuit 41 determines a state of the door switch 12. The integrated circuit 41 performs the intermittent operation for intermittently monitoring states of the switches or the constant monitoring operation for constantly monitoring states of the switches, as a switch state monitoring method.

The integrated circuit 41 switches on/off states of the switch current sources B0 to B5 of the switch current source group B by the control signals Scb0 to Scb5, and generates monitoring signals INB0 to INB5 as current signals. The integrated circuit 41 determines whether or not the monitoring signals INB0 to INB5 flow to the window switch 13 via the terminal 33 and the wire harness 23, so that the integrated circuit 41 determines a state of the window switch 13. The integrated circuit 41 performs the intermittent operation for intermittently monitoring states of the switches or the constant monitoring operation for constantly monitoring states of the switches, as a switch state monitoring method.

The integrated circuit 41 stores monitoring result information of states of the head light switch 11, the door switch 12, and the window switch 13, in the internal register 42.

The MPU 50 regularly accesses the integrated circuit 41 by SPI communication and acquires monitoring result information of switch states stored in the internal register 42.

The MPU 50 controls the driver IC 60, the driver IC 61, and the like to operate based on the monitoring result information of switch states stored in the internal register 42, and controls various actuators 90.

FIG. 2 is a schematic circuit diagram in which the switch state detection circuit 40 of FIG. 1 is enlarged and illustrated in detail. The switch state detection circuit 40 of FIG. 2 adopts a pull-up type in which the switch current source is connected between the power supply terminal and an external switch to be detected. The pull-up type is adopted in cases where the external switch to be detected is connected to a ground terminal (low potential terminal) GND. Note that the wire harnesses 21 to 23 and the terminals 31 to 33 are not illustrated in FIG. 2. Hereinafter, the schematic circuit diagram of FIG. 2 is described.

As illustrated in FIG. 2, the switch current source group Z is constituted of the eight switch current sources Z0 to Z7. The switch current source group A is constituted of the eight switch current sources A0 to A7 (not shown). The switch current source group B is constituted of the six switch current sources B0 to B5 (not shown).

The integrated circuit 41 generates the control signals Scz0 to Scz7 based on the setting data information stored in the internal register 42 and the on/off state information of the vehicle engine from the MPU 50. The control signals Scz0 to Scz7 control on/off states of the switch current sources Z0 to Z7 of the switch current source group Z. Note that the control signals Scz0 to Scz7 may have predetermined time lags, respectively.

The integrated circuit 41 performs the intermittent operation for intermittently monitoring on/off states of switches 110 to 117 included in the head light switch 11 and the constant monitoring operation for constantly monitoring on/off states of the switches 110 to 117 included in the head light switch 11, by the monitoring signals INZ0 to INZ7. In addition, the integrated circuit 41 generates the monitoring signals INZ0 to INZ7 having predetermined time lags by the control signals Scz0 to Scz7 having predetermined time lags, and performs sequential monitoring operation for sequentially monitoring on/off states of the switches 110 to 117 included in the head light switch 11 by the monitoring signals INZ0 to INZ7 having predetermined time lags.

In the same manner, the integrated circuit 41 performs the intermittent operation for intermittently monitoring on/off states of the eight switches (not shown) included in the door switch 12 and the constant monitoring operation for constantly monitoring on/off states of the eight switches (not shown) included in the door switch 12, by the monitoring signals INA0 to INA7. In addition, the integrated circuit 41 generates the monitoring signals INA0 to INA7 having predetermined time lags by the control signals Sca0 to Sca7 having predetermined time lags, and performs the sequential monitoring operation for sequentially monitoring the on/off states of the eight switches (not shown) included in the door switch 12, by the monitoring signals INA0 to INA7 having predetermined time lags.

In the same manner, the integrated circuit 41 performs the intermittent operation for intermittently monitoring on/off states of six switches (not shown) included in the window switch 13 and the constant monitoring operation for constantly monitoring on/off states of the six switches (not shown) included in the window switch 13, by the monitoring signals INB0 to INB5. In addition, the integrated circuit 41 generates the monitoring signals INB0 to INB5 having predetermined time lags by the control signals Scb0 to Scb5 having predetermined time lags, and these monitoring signals INB0 to INB5 having predetermined time lags are used for performing the sequential monitoring operation for sequentially monitoring on/off states of the six switches (not shown) included in the window switch 13.

Note that information of a result of the monitoring operation described above is stored in the internal register 42 of the integrated circuit 41. After that, the MPU 50 regularly accesses the integrated circuit 41 by SPI communication and acquires the monitoring result information of switch states stored in the internal register 42.

Figure 3:
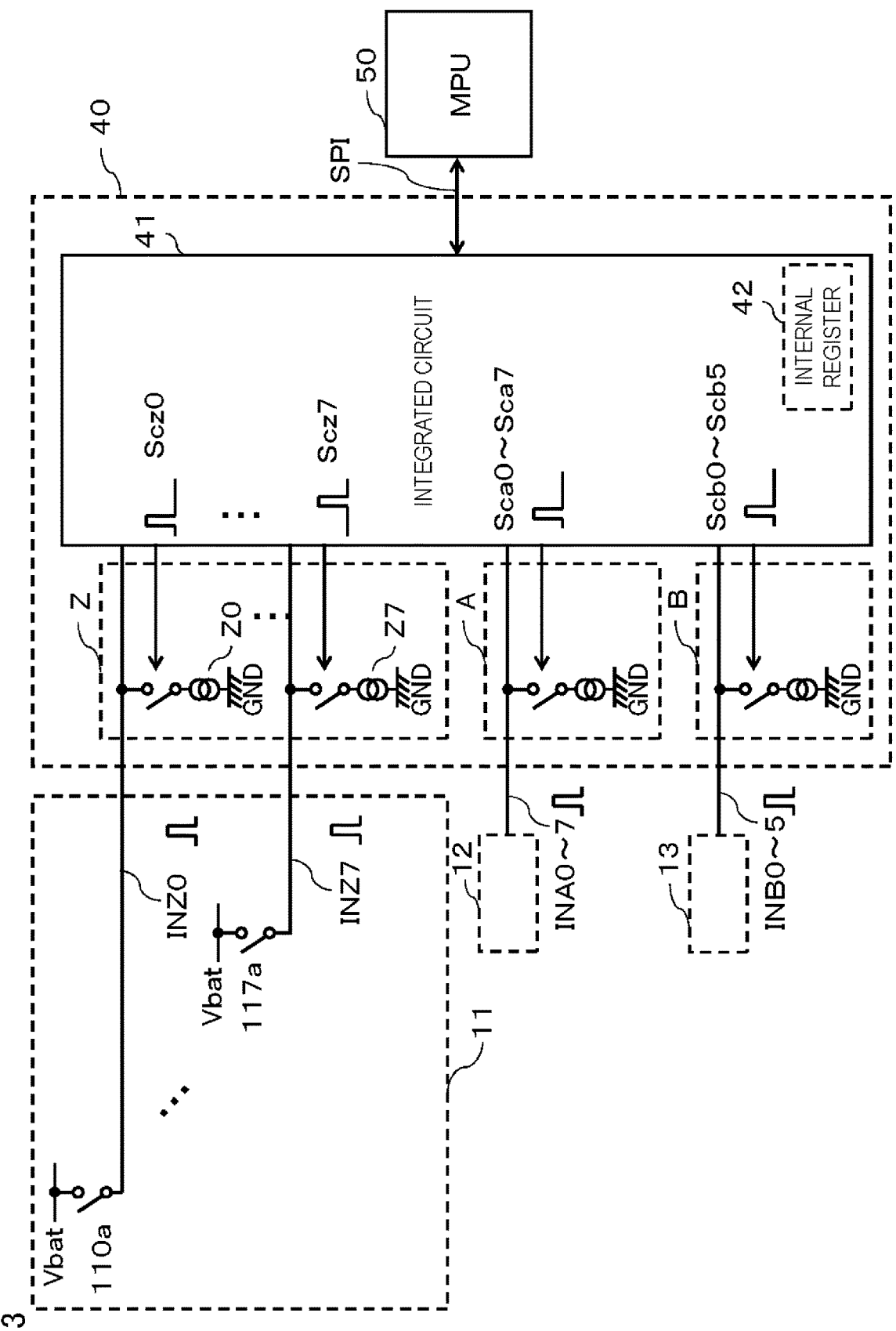
FIG. 3 is a schematic circuit diagram illustrating another switch detection circuit of the embodiment of the present invention.

FIG. 3 is a schematic circuit diagram illustrating another structural example of the switch state detection circuit 40 of FIG. 1. The switch state detection circuit 40 of FIG. 3 adopts a pull-down type in which the switch current source is connected between the external switch to be detected and the ground terminal (low potential terminal) GND. The pull-down type is adopted in cases where the external switch to be detected is connected not to the ground terminal (low potential terminal) GND but to the power supply terminal of a battery Vbat or the like. In this case, an output of the comparator (not shown) in the integrated circuit 41 is opposite to the pull-up type illustrated in FIG. 2. Note that the wire harnesses 21 to 23 and the terminals 31 to 33 are not illustrated in FIG. 3. Hereinafter, the switch state detection circuit 40 of FIG. 3 is described.

As illustrated in FIG. 3, the switch current source group Z is constituted of the eight switch current sources Z0 to Z7. The switch current source group A is constituted of the eight switch current sources A0 to A7 (not shown). The switch current source group B is constituted of the six switch current sources B0 to B5 (not shown).

The integrated circuit 41 generates the control signals Scz0 to Scz7 based on the setting data information stored in the internal register 42 and the on/off state information of the vehicle engine from the MPU 50. The control signals Scz0 to Scz7 controls on/off states of the switch current sources Z0 to Z7 of the switch current source group Z. Note that the control signals Scz0 to Scz7 may have predetermined time lags, respectively.

The integrated circuit 41 performs the intermittent operation for intermittently monitoring on/off states of switches 110a to 117a included in the head light switch 11 and the constant monitoring operation for constantly monitoring on/off states of the switches 110a to 117a included in the head light switch 11, by the monitoring signals INZ0 to INZ7. In addition, the integrated circuit 41 generates the monitoring signals INZ0 to INZ7 having predetermined time lags by the control signals Scz0 to Scz7 having predetermined time lags, and performs the sequential monitoring operation for sequentially monitoring on/off states of the switches 110a to 117a included in the head light switch 11, by the monitoring signals INZ0 to INZ7 having predetermined time lags.

In the same manner, the integrated circuit 41 performs the intermittent operation for intermittently monitoring on/off states of the eight switches (not shown) included in the door switch 12 and the constant monitoring operation for constantly monitoring on/off states of the eight switches (not shown) included in the door switch 12, by the monitoring signals INA0 to INA7. In addition, the integrated circuit 41 generates the monitoring signals INA0 to INA7 having predetermined time lags by the control signals Sca0 to Sca7 having predetermined time lags, and performs the sequential monitoring operation for sequentially monitoring on/off states of the eight switches (not shown) included in the door switch 12, by the monitoring signals INA0 to INA7 having predetermined time lags.

In the same manner, the integrated circuit 41 performs the intermittent operation for intermittently monitoring on/off states of the six switches (not shown) included in the window switch 13 and the constant monitoring operation for constantly monitoring on/off states of the six switches (not shown) included in the window switch 13, by the monitoring signals INB0 to INB5. In addition, the integrated circuit 41 generates the monitoring signals INB0 to INB5 having predetermined time lags by the control signals Scb0 to Scb5 having predetermined time lags, and performs the sequential monitoring operation for sequentially monitoring on/off states of the six switches (not shown) included in the window switch 13, by the monitoring signals INB0 to INB5 having predetermined time lags.

Note that information of a result of the monitoring operation described above is stored in the internal register 42 of the integrated circuit 41. After that, the MPU 50 regularly accesses the integrated circuit 41 by SPI communication and acquires the monitoring result information of switch states stored in the internal register 42.

As described above, the switch state detection circuit 40 of FIG. 3 adopts a pull-down type in which the switch current source is connected between the external switch to be detected and the ground terminal (low potential terminal) GND. However, the switch state detection circuit 40 may adopt both the pull-up type illustrated in FIG. 2 and the pull-down type illustrated in FIG. 3. For example, the switch current source group Z and the switch current source group A may adopt the pull-up type, while the switch current source group B may adopt the pull-down type. In addition, switching between the pull-up type and the pull-down type may be performed for every switch current source.

Figure 4:
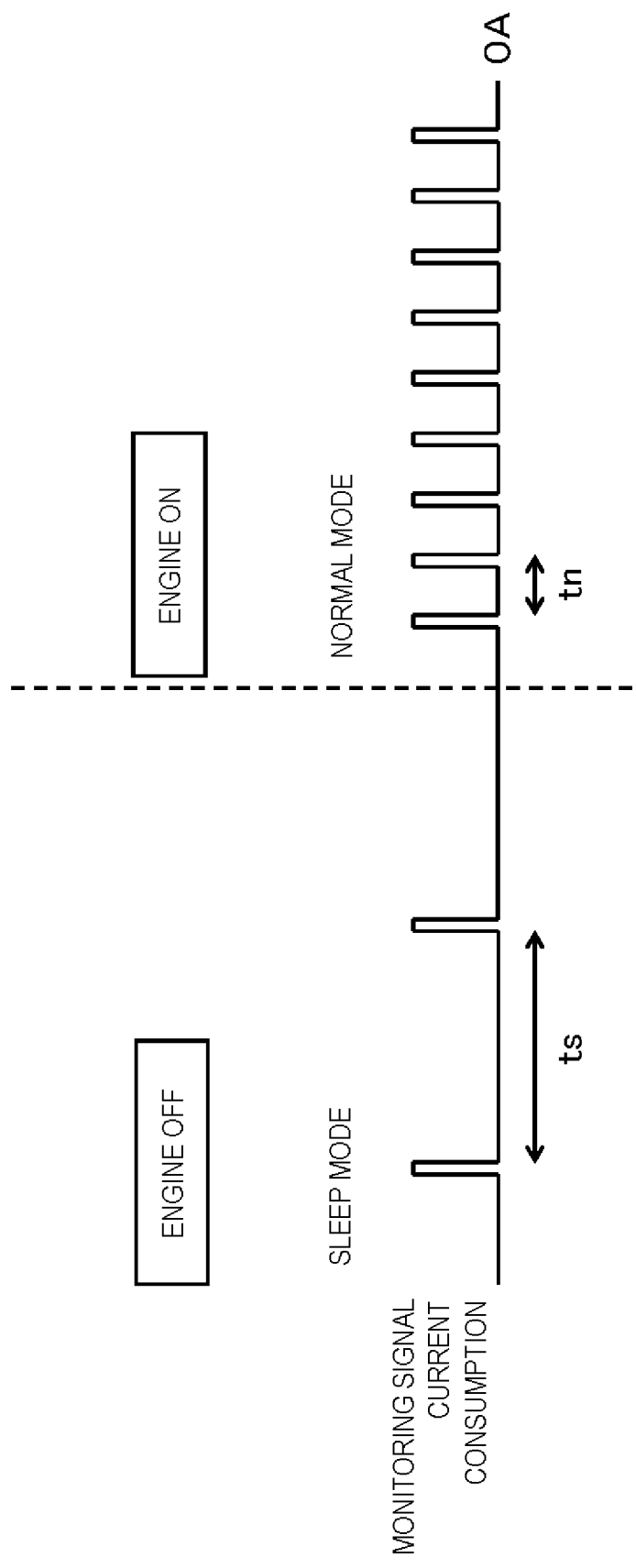
FIG. 4 is a diagram illustrating current consumption of the switch detection circuit when an engine is turned on and off in the embodiment of the present invention.

FIG. 4 is a schematic diagram illustrating current consumption of the switch state detection circuit when the engine is turned on and off in the embodiment of the present invention. Hereinafter, current consumption when the engine is turned on and off illustrated in FIG. 4 is described.

As illustrated in FIG. 4, control modes of the switches in the vehicle according to the vehicle switch control device and the switch state detection method of the embodiment of the present invention include a sleep mode when the vehicle engine is turned off and a normal mode when the vehicle engine is turned on. In the sleep mode and the normal mode, current is controlled so that a continuous or intermittent monitoring signal flows in each switch in the vehicle. Normally, the sleep mode and the normal mode are set to have different monitoring periods. Period ts of the monitoring signal in the sleep mode is set longer than period tn of the monitoring signal in the normal mode. In this way, current consumption when the vehicle engine is turned off is smaller than current consumption when the engine is turned on. The period ts of the monitoring signal in the sleep mode is set to 50 ms, for example. The period tn of the monitoring signal in the normal mode is set to 5 ms, for example. In this case, the period ts of the monitoring signal in the sleep mode is ten times the period tn of the monitoring signal in the normal mode. In order to increase the frequency of monitoring switch states in the normal mode, the period tn of the monitoring signal in the normal mode is set shorter than the period ts of the monitoring signal in the sleep mode. However, the period tn of the monitoring signal in the normal mode may be set longer than the period ts of the monitoring signal in the sleep mode. In addition, the period tn of the monitoring signal in the normal mode may be set to the same value as the period ts of the monitoring signal in the sleep mode.

Figure 5:
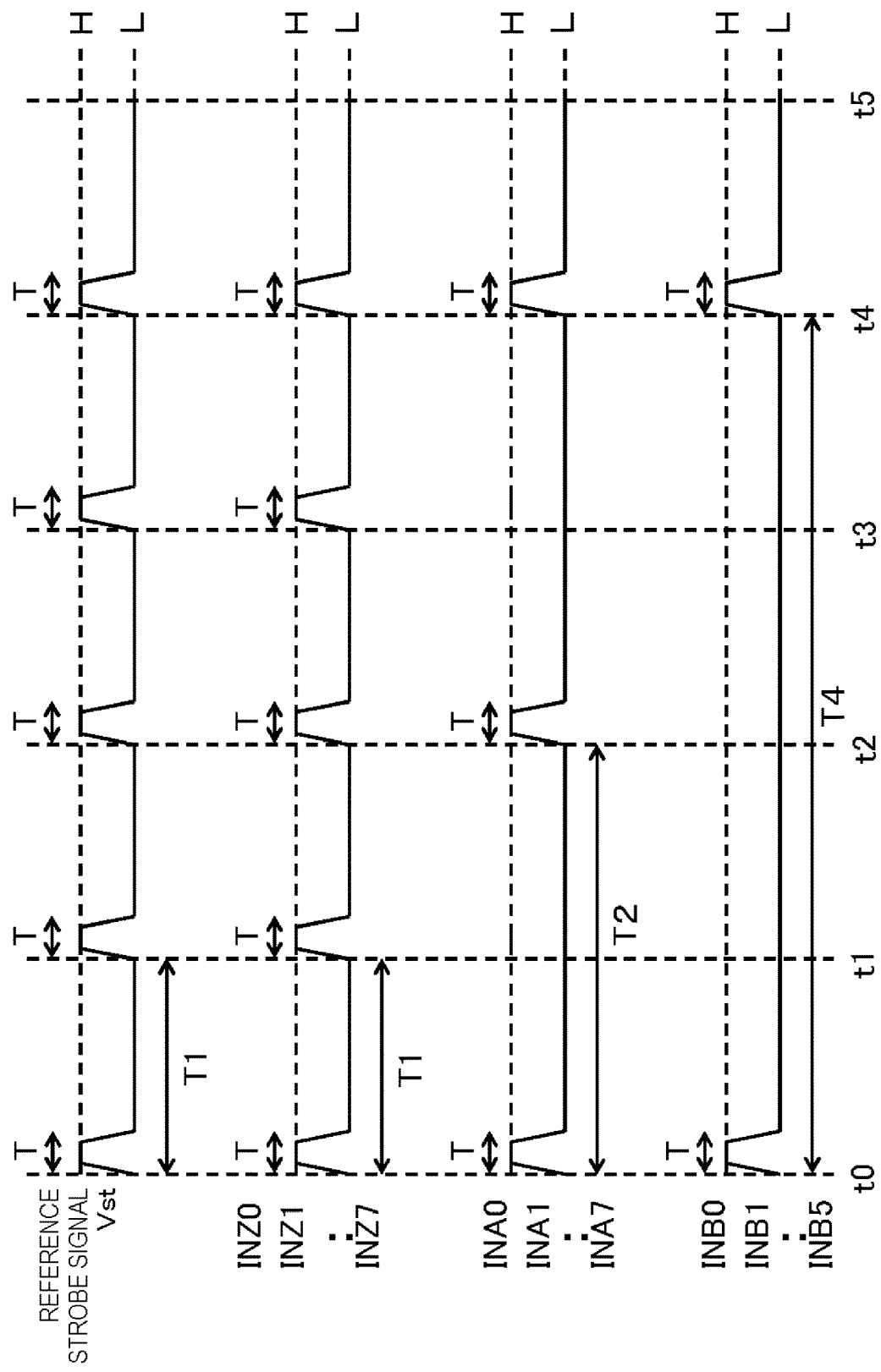
FIG. 5 is a timing chart of switch signals used in the embodiment of the present invention.

FIG. 5 is a timing chart illustrating one setting example of the monitoring signal used in the embodiment of the present invention. In the example of FIG. 5, the switch current source group Z, intermittent monitoring for intermittently monitoring switch states is performed for each of the switch current source group A and the switch current source group B. In addition, the period of the monitoring signal is set for each of the switch current source group Z, the switch current source group A, and the switch current source group B. Note that symbol T in FIG. 5 indicates a period while a reference strobe signal Vst described later is high level H, a period while the monitoring signal of high level H of the switch current source group is output, and a period while the switch current source group is turned on. Hereinafter, described is one example of setting the period of the monitoring signal in the vehicle switch control device and the switch state detection method in the embodiment of the present invention.

The switch current source group Z, the switch current source group A, and the switch current source group B generate the monitoring signals INZ0 to INZ7, the monitoring signals INA0 to INA7, and the monitoring signals INB0 to INB5 using the reference strobe signal Vst of an internal reference voltage source (not shown) of the switch state detection circuit 40. These monitoring signals are high level H during the period T.

The reference strobe signal Vst becomes high level H at the period T1. The switch current source group Z outputs the monitoring signals INZ0 to INZ7 at the period T1. The switch current source group A outputs the monitoring signals INA0 to INA7 at the period T2. The switch current source group B outputs the monitoring signals INB0 to INB5 at the period T4. The period T2 is substantially twice the period T1. The period T4 is substantially four times the period T1 and is substantially twice the period T2.

In the period T from time t0 to time t1, there is a period during which the reference strobe signal Vst is high level H. The switch current source group Z has a period during which the monitoring signals INZ0 to INZ7 are output. The switch current source group A has a period during which the monitoring signals INA0 to INA7 are output. The switch current source group B has a period during which the monitoring signals INB0 to INB5 are output.

In the period T from time t1 to time t2, there is a period during which the reference strobe signal Vst is high level H. The switch current source group Z has a period during which the monitoring signals INZ0 to INZ7 are output. On the other hand, the switch current source group A does not output the monitoring signals INA0 to INA7. The switch current source group B does not output the monitoring signals INB0 to INB5.

In the period T from time t2 to time t3, there is a period during which the reference strobe signal Vst is high level H. The switch current source group Z has a period during which the monitoring signals INZ0 to INZ7 are output. The switch current source group A has a period during which the monitoring signals INA0 to INA7 are output. On the other hand, the switch current source group B does not output the monitoring signals INB0 to INB5.

In the period T from time t3 to time t4, there is a period during which the reference strobe signal Vst is high level H. The switch current source group Z has a period during which the monitoring signals INZ0 to INZ7 are output. On the other hand, the switch current source group A does not output the monitoring signals INA0 to INA7. The switch current source group B does not output the monitoring signals INB0 to INB5.

In the period T from time t4 to time t5, there is a period during which the reference strobe signal Vst is high level H. The switch current source group Z has a period during which the monitoring signals INZ0 to INZ7 are output. The switch current source group A has a period during which the monitoring signals INA0 to INA7 are output. The switch current source group B has a period during which the monitoring signals INB0 to INB5 are output.

As described above with reference to FIG. 5, in the vehicle switch control device and the switch state detection method in the embodiment of the present invention, the monitoring signals INZ0 to INZ7, the monitoring signals INA0 to INA7, and the monitoring signals INB0 to INB5 are respectively output to the switch current source group Z, the switch current source group A, and the switch current source group B at different periods. In this way, current consumption can be reduced. In addition, it is possible to reduce radiation noise when all switches of the switch current source group Z, the switch current source group A, and the switch current source group B are simultaneously turned on to flow currents so that magnetic fields are generated. Note that in FIG. 5, for convenience sake of description, in the period from time t0 to time t1 and in the period from time t4 to time t5, three of the switch current source group Z, the switch current source group A, and the switch current source group B are turned on simultaneously during the period T, but this is not a limitation. The switch current source group Z, the switch current source group A, and the switch current source group B may be turned on during different periods T partially or completely shifted from each other. In this case, radiation noise is further reduced.

Figure 6:
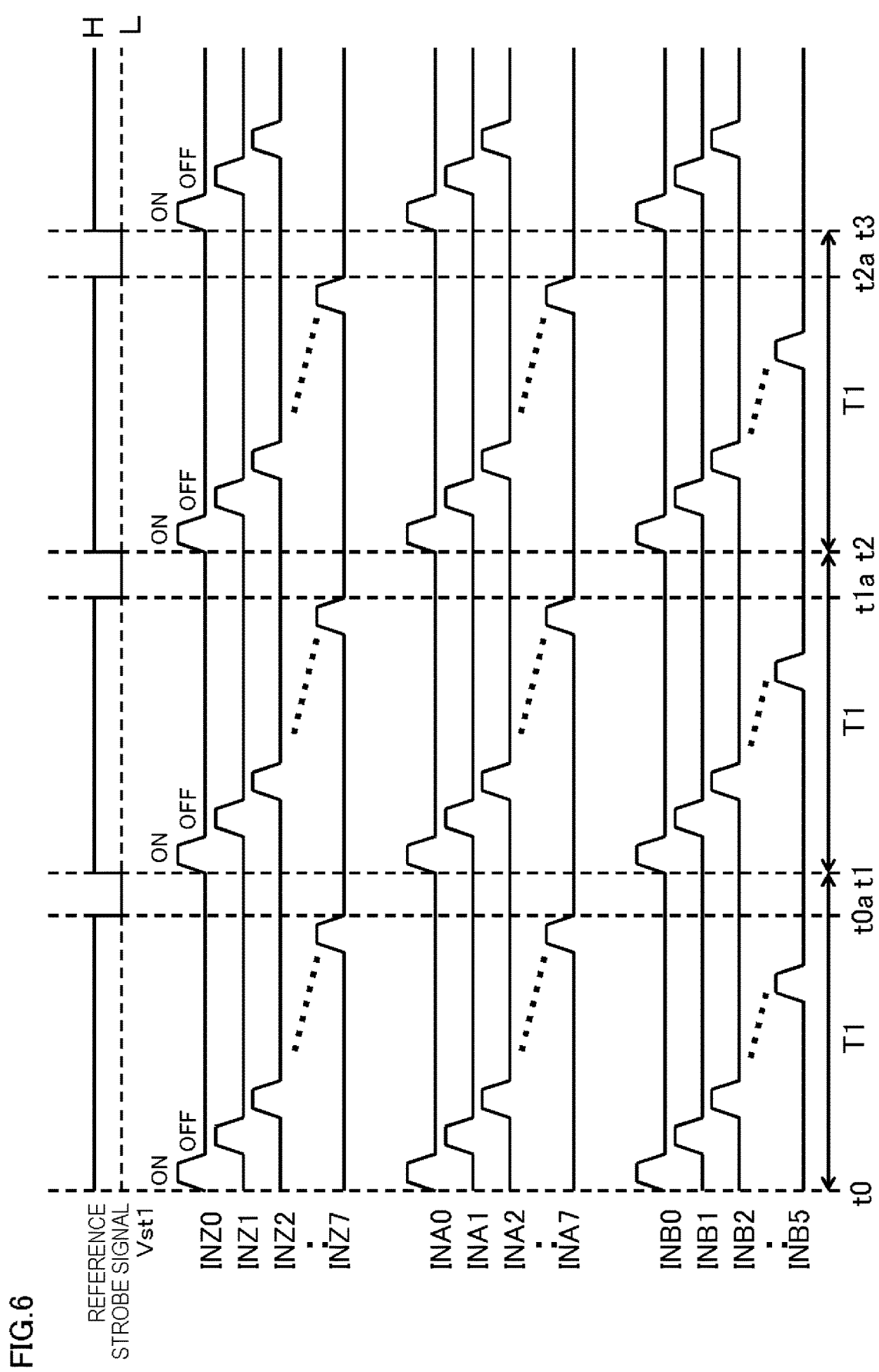
FIG. 6 is another timing chart of the switch signals used in the embodiment of the present invention.

FIG. 6 is another timing chart illustrating another setting example of the monitoring signals used in the embodiment of the present invention. In the setting example of FIG. 6, unlike the example of FIG. 5, the sequential monitoring is performed, in which the monitoring signals INZ0 to INZ7 are sequentially output in the switch current sources Z0 to Z7, the monitoring signals INA0 to INA7 are sequentially output in the switch current sources A0 to A7, and the monitoring signals INB0 to INB5 are sequentially output in the switch current sources B0 to B5. Hereinafter, described is the sequential monitoring of FIG. 6 as one example of setting the intermittent operation of the vehicle switch control device and the switch state detection method in the embodiment of the present invention.

A reference strobe signal Vst1 is high level H from time t0 to time t0a and is low level L from time t0a to time t1. The reference strobe signal Vst1 is high level H from time t1 to time t1a and is low level L from time t1a to time t2. The reference strobe signal Vst1 is high level H from time t2 to time t2a and is low level L from time t2a to time t3. After that, in the same manner, the reference strobe signal Vst1 is switched to high level H or low level L at the period T1.

The switch current sources Z0 to Z7 sequentially output the monitoring signals INZ0 to INZ7 from time t0 to time t0a. The reference strobe signal Vst1 is low level L from time t0a to time t1, and hence the switch current sources Z0 to Z7 do not output the monitoring signals INZ0 to INZ7. In the same manner, the switch current sources Z0 to Z7 sequentially output the monitoring signals INZ0 to INZ7 from time t1 to time t1a. The reference strobe signal Vst1 is low level L from time t1a to time t2, and hence the switch current sources Z0 to Z7 do not output the monitoring signals INZ0 to INZ7. After that, the switch current sources Z0 to Z7 repeat the same operation. In other words, the switch current sources Z0 to Z7 sequentially output the monitoring signals INZ0 to INZ7 at the period T1 similar to the period from time t0 to time t1.

The switch current sources A0 to A7 sequentially output the monitoring signals INA0 to INA7 from time t0 to time t0a. The reference strobe signal Vst1 is low level L from time t0a to time t1, and hence the switch current sources A0 to A7 do not output the monitoring signals INA0 to INA7. In the same manner, the switch current sources A0 to A7 sequentially output the monitoring signals INA0 to INA7 from time t1 to time t1a. The reference strobe signal Vst1 is low level L from time t1a to time t2, and hence the switch current sources A0 to A7 do not output the monitoring signals INA0 to INA7. After that, the switch current sources A0 to A7 repeat the same operation. In other words, the switch current sources A0 to A7 sequentially output the monitoring signals INA0 to INA7 at the period T1 similar to the period from time t0 to time t1.

The switch current sources B0 to B5 sequentially output the monitoring signals INB0 to INB5 from time t0 to time t0a. The reference strobe signal Vst1 is low level L from time t0a to time t1, and hence the switch current sources B0 to B5 do not output the monitoring signals INB0 to INB5. In the same manner, the switch current sources B0 to B5 sequentially output the monitoring signals INB0 to INB5 from time t1 to time t1a. The reference strobe signal Vst1 is low level L from time t1a to time t2, and hence the switch current sources B0 to B5 do not output the monitoring signals INB0 to INB5. After that, the switch current sources B0 to B5 repeat the same operation. In other words, the switch current sources B0 to B5 sequentially output the monitoring signals INB0 to INB5 at the period T1 similar to the period from time t0 to time t1.

In the setting example of FIG. 6 described above, unlike the setting example of FIG. 5, the sequential monitoring is performed, in which the monitoring signals INZ0 to INZ7 are sequentially output in the switch current sources Z0 to Z7, the monitoring signals INA0 to INA7 are sequentially output in the switch current sources A0 to A7, and the monitoring signals INB0 to INB5 are sequentially output in the switch current sources B0 to B5. In this way, the output periods of the monitoring signals INZ0 to INZ7 are not overlapped in the switch current sources Z0 to Z7, the output periods of the monitoring signals INA0 to INA7 are not overlapped in the switch current sources A0 to A7, and the output period of the monitoring signals INB0 to INB5 are not overlapped in the switch current sources B0 to B5. In other words, two or more of the switch current sources are not simultaneously turned on in the switch current sources Z0 to Z7, in the switch current sources A0 to A7, and in the switch current sources B0 to B5. Therefore, in the setting example of FIG. 6, radiation noise is reduced more than in the normal intermittent monitoring by the setting example of FIG. 5. Further, the maximum current consumption is reduced, and hence the power supply can be downsized.

Figure 7:
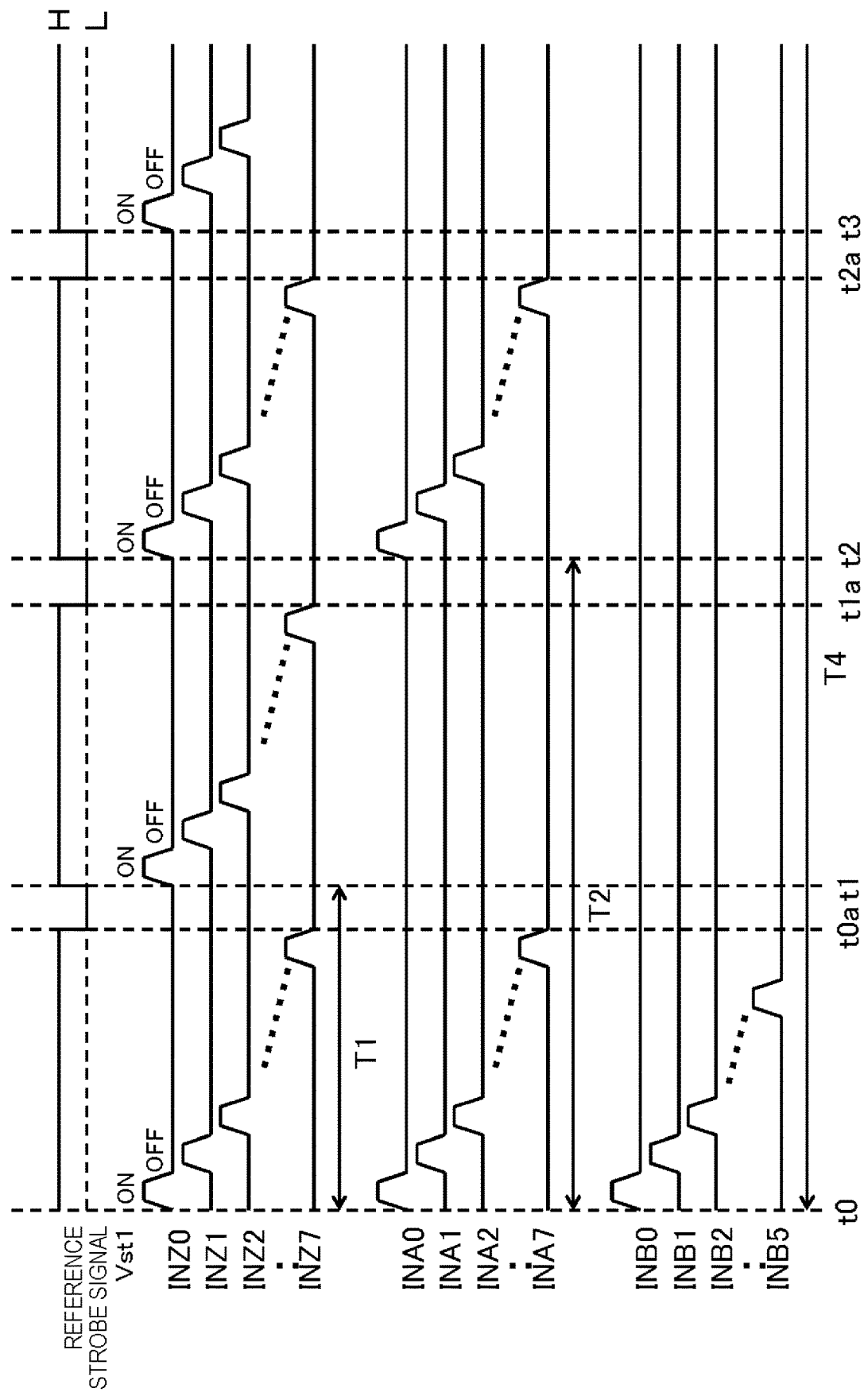
FIG. 7 is still another timing chart of the switch signals used in the embodiment of the present invention.

FIG. 7 is a timing chart illustrating still another setting example of the monitoring signals used in the embodiment of the present invention. In the setting example of FIG. 7, the period of the intermittent operation is set for each of the switch current source group Z, the switch current source group A, and the switch current source group B in the same manner as in the setting example of FIG. 5. In addition, in the same manner as in the setting example of FIG. 6, the sequential monitoring is performed, in which the monitoring signals INZ0 to INZ7 are sequentially output in the switch current sources Z0 to Z7, the monitoring signals INA0 to INA7 are sequentially output in the switch current sources A0 to A7, and the monitoring signals INB0 to INB5 are sequentially output in the switch current sources B0 to B5. Hereinafter, as one example of setting the intermittent operation in the vehicle switch control device and the switch state detection method in the embodiment of the present invention, the sequential monitoring operation setting of FIG. 7 is described. Note that in the vehicle switch control device and the switch state detection method in the embodiment of the present invention of FIG. 7, unlike FIG. 6, the intermittent monitoring is performed for the switch current source group Z, the switch current source group A, and the switch current source group B at different periods of the period T1, the period T2, and the period T4, respectively.

The reference strobe signal Vst1 is high level H from time t0 to time t0a and is low level L from time t0a to time t1. The reference strobe signal Vst1 is high level H from time t1 to time t1a and is low level L from time t1a to time t2. The reference strobe signal Vst1 is high level H from time t2 to time t2a and is low level L from time t2a to time t3. After that, in the same manner, the reference strobe signal Vst1 is switched to high level H or low level L at period T1.

The switch current sources Z0 to Z7 sequentially output the monitoring signals INZ0 to INZ7 from time t0 to time t0a. The reference strobe signal Vst1 is low level L from time t0a to time t1, and hence the switch current sources Z0 to Z7 do not output the monitoring signals INZ0 to INZ7. In the same manner, the switch current sources Z0 to Z7 sequentially output the monitoring signals INZ0 to INZ7 from time t1 to time t1a. The reference strobe signal Vst1 is low level L from time t1a to time t2, and hence the switch current sources Z0 to Z7 do not output the monitoring signals INZ0 to INZ7. After that, the switch current sources Z0 to Z7 repeat the same operation. In other words, the switch current sources Z0 to Z7 sequentially output the monitoring signals INZ0 to INZ7 at the period T1 similar to the period from time t0 to time t1.

The switch current sources A0 to A7 sequentially output the monitoring signals INA0 to INA7 from time t0 to time t0a. The reference strobe signal Vst1 is low level L from time t0a to time t1, and hence the switch current sources A0 to A7 do not output the monitoring signals INA0 to INA7. The switch current sources A0 to A7 do not output the monitoring signals INA0 to INA7 also from time t1 to time t2. The monitoring signals INA0 to INA7 are sequentially output from time t2 to time t2a. The reference strobe signal Vst1 is low level L from time t2a to time t3, and hence the switch current sources A0 to A7 do not output the monitoring signals INA0 to INA7. After that, the switch current sources A0 to A7 repeat the same operation. In other words, the switch current sources A0 to A7 sequentially repeat output of the monitoring signals INA0 to INA7 at the period T2 similar to the period from time t0 to time t2.

The switch current sources B0 to B5 sequentially output the monitoring signals INB0 to INB5 from time t0 to time t0a. The reference strobe signal Vst1 is low level L from time t0a to time t1, and hence the switch current sources B0 to B5 do not output the monitoring signals INB0 to INB5. The switch current sources B0 to B5 do not output the monitoring signals INB0 to INB5 also from time t1 to time t4 (not shown). From time t4 (not shown) to time t4a (not shown), the switch current sources B0 to B5 sequentially output the monitoring signals INB0 to INB5. After that, the switch current sources B0 to B5 repeat the same operation. In other words, the switch current sources B0 to B5 sequentially repeat output of the monitoring signals INB0 to INB5 at the period T4 similar to the period from time t0 to time t4.

In the setting example of FIG. 7 described above, the period for outputting the monitoring signal can be set for each of the switch current source group Z, the switch current source group A, and the switch current source group B. In this way, current consumption can be reduced. In addition, in the setting example of FIG. 7, the sequential monitoring is performed, in which the monitoring signals INZ0 to INZ7 are sequentially output in the switch current sources Z0 to Z7, the monitoring signals INA0 to INA7 are sequentially output in the switch current sources A0 to A7, and the monitoring signals INB0 to INB5 are sequentially output in the switch current sources B0 to B5. In this way, the output periods of the monitoring signals INZ0 to INZ7 are not overlapped in the switch current sources Z0 to Z7, the output periods of the monitoring signals INA0 to INA7 are not overlapped in the switch current sources A0 to A7, and the output periods of the monitoring signals INB0 to INB5 are not overlapped in the switch current sources B0 to B5. In other words, two or more of the switch current sources are not simultaneously turned on in the switch current sources Z0 to Z7, in the switch current sources A0 to A7, and in the switch current sources B0 to B5. Therefore, in the setting example of FIG. 7, radiation noise is reduced more than in the normal intermittent monitoring by the setting example of FIG. 5 described above. Further, the maximum current consumption is reduced, and hence the power supply can be downsized.

Figure 8:
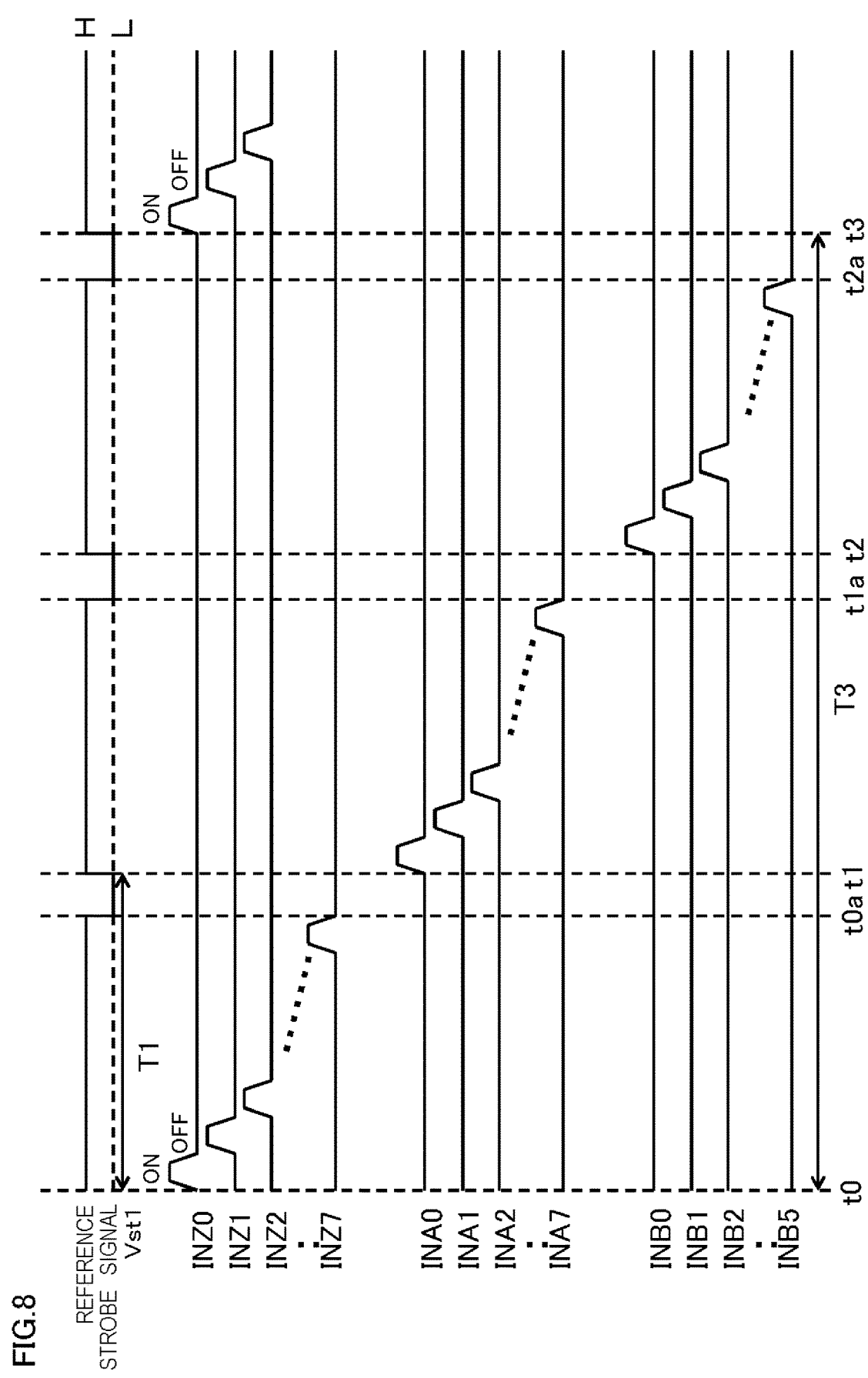
FIG. 8 is still another timing chart of the switch signals used in the embodiment of the present invention.

FIG. 8 is a timing chart illustrating still another setting example of the monitoring signals used in the embodiment of the present invention. In the setting example of FIG. 8, unlike setting examples of FIGS. 5 to 7, all switch uniform sequential monitoring is performed, in which all monitoring signals of the monitoring signals INZ0 to INZ7, the monitoring signals INA0 to INA7, and the monitoring signals INB0 to INB5 are sequentially output. In other words, in the all switch uniform sequential monitoring, the switch current sources Z0 to Z7, the switch current sources A0 to A7, and the switch current sources B0 to B5 are sequentially switched.

The reference strobe signal Vst1 is high level H from time t0 to time t0a and is low level L from time t0a to time t1. The reference strobe signal Vst1 is high level H from time t1 to time t1a and is low level L from time t1a to time t2. The reference strobe signal Vst1 is high level H from time t2 to time t2a and is low level L from time t2a to time t3. After that, in the same manner, the reference strobe signal Vst1 is switched to high level H or low level L at the period T1.

The switch current sources Z0 to Z7 sequentially output the monitoring signals INZ0 to INZ7 from time t0 to time t0a. From time t0a to time t1, the reference strobe signal Vst1 is low level L, and hence the switch current sources Z0 to Z7 do not output the monitoring signals INZ0 to INZ7. From time t1 to time t3, the switch current sources Z0 to Z7 do not output the monitoring signals INZ0 to INZ7. After that, the switch current sources Z0 to Z7 repeat the same operation. In other words, the switch current sources Z0 to Z7 sequentially repeat output of the monitoring signals INZ0 to INZ7 at period T3 from time t0 to time t3.

The switch current sources A0 to A7 do not output the monitoring signals INA0 to INA7 from time t0 to time t1. The switch current sources A0 to A7 sequentially output the monitoring signals INA0 to INA7 from time t1 to time t1a. The reference strobe signal Vst1 is low level L from time t1a to time t2, and hence the switch current sources A0 to A7 do not output the monitoring signals INA0 to INA7. After that, the switch current sources A0 to A7 repeat the same operation. In other words, the switch current sources A0 to A7 sequentially repeat output of the monitoring signals INA0 to INA7 at the period T3 from time t1.

The switch current sources B0 to B5 do not output the monitoring signals INB0 to INB5 from time t0 to time t2. The switch current sources B0 to B5 sequentially output the monitoring signals INB0 to INB5 from time t2 to time t2a. The reference strobe signal Vst1 is low level L from time t2a to time t3, and hence the switch current sources B0 to B5 do not output the monitoring signals INB0 to INB5. After that, the switch current sources B0 to B5 repeat the same operation. In other words, the switch current sources B0 to B5 repeat output of the monitoring signals INB0 to INB5 at the period T3 from time t2.

In the setting example of FIG. 8 described above, it is possible to perform the all switch uniform sequential monitoring, in which the switch current sources Z0 to Z7 sequentially output the monitoring signals INZ0 to INZ7, and after that the switch current sources A0 to A7 sequentially output the monitoring signals INA0 to INA7, and after that the switch current sources B0 to B5 sequentially output the monitoring signals INB0 to INB5. In this way, in all the switch current sources, two or more switch current sources are not simultaneously turned on, and hence radiation noise is reduced more than the intermittent operation by the setting example of FIG. 6 or 7.

Figure 9:
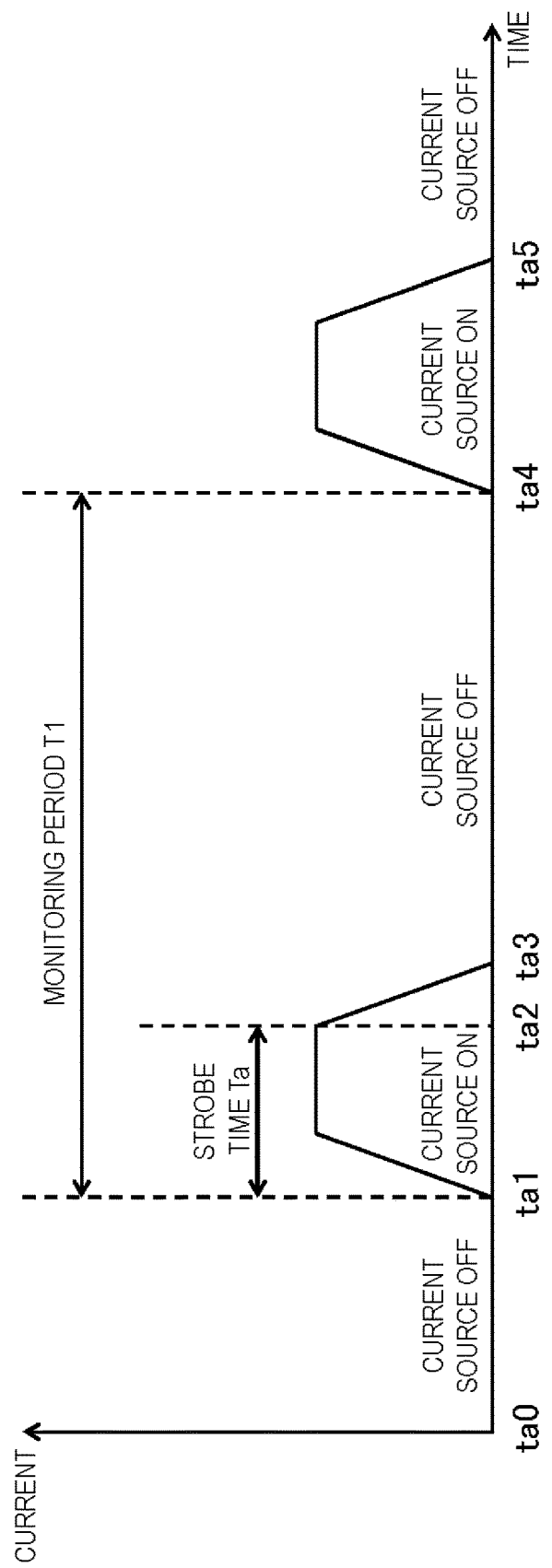
FIG. 9 is a timing chart related to a monitoring signal of the switch signals used in the embodiment of the present invention.

FIG. 9 is a timing chart related to the monitoring signals in the present invention. In the vehicle switch control device and the switch state detection method in the embodiment of the present invention, strobe time as monitoring time can be set by a monitoring time value of the internal register 42. Hereinafter, the monitoring signal of the vehicle switch control device and the switch state detection method in the embodiment of the present invention is described.

The reference strobe signal Vst1 is low level L from time ta0 to time ta1. The reference strobe signal Vst1 is high level H from time ta1 to time ta3. In this period, the switch current source becomes turned on, and hence the monitoring signal is generated. The internal reference voltage is low level L from time ta3 to time ta4. The reference strobe signal Vst1 is high level H at time ta4 to time ta5. In this period, the switch current source becomes turned on, and hence the monitoring signal is generated. After that, the same operation is repeated.

The states of the head light switch 11, the door switch 12, and the window switch 13 illustrated in FIG. 1 are monitored in a period of strobe time Ta from time ta1 to time ta2. The strobe time Ta can be set to an integer multiple of period of an oscillator (not shown in FIG. 1) by the monitoring time value of the internal register 42. If the period of the oscillator is 31.25 μsec, for example, the strobe time Ta can be set to 93.75 μsec, 125 μsec, 187.5 μsec, 250 μsec, or the like, for example.

Time period from time ta1 to time ta4 is monitoring period T1. The monitoring period T1 can be set to 2.5 msec, 5 msec, 10 msec, 20 msec, 30 msec, 40 msec, or 50 msec by an internal register value, for example.

As described above, in the vehicle switch control device and the switch state detection method of the present invention, the strobe time and the monitoring period can be set by the monitoring time value of the internal register. In this way, current consumption can be reduced by desired degree.

FIG. 10A is a diagram illustrating one example of the normal mode setting command in the embodiment of the present invention. Hereinafter, the normal mode setting command of the vehicle switch control device and the switch state detection method in the embodiment of the present invention is described.

The normal mode setting command illustrated in FIG. 10A is written in the EEPROM 51 of FIG. 1 by a user. The setting command includes an 8-bit register address, a 24-bit setting data, and an 8-bit cyclic redundancy check CRC (cyclic redundancy code). A value of 39th to 32th bits of the setting command indicate a register address. A value of 31th to 8th bits of the setting command indicate a setting data. A value of 7th to 0th bits of the setting command indicate a cyclic redundancy check CRC. In each bit, "0" corresponds to low level L of the signal, while "1" corresponds to high level H of the signal. A bit accompanied with "x" does not affect the operation. The register address of the setting command indicates an address of a register area in the internal register 42. In the example of FIG. 10A, "01001011" ("4B" in hexadecimal) is set as the register address. Hereinafter, in the internal register 42, an address area designated by the register address "01001011" is denoted by "FMR". The MPU 50 of FIG. 1 writes the setting data in the register area FMR in the internal register 42 designated by the register address of the setting command. In the vehicle switch control device and the switch state detection method in the embodiment of the present invention, the monitoring time value of the internal register 42 can set the monitoring period, the strobe time, and a type of the intermittent monitoring in the normal mode.

A value of the 31th bit (FSQ) of the setting data is related to setting of the all switch uniform sequential monitoring in the normal mode. A value of the 30th bit (FSQB) is related to the sequential monitoring of the switch current source group B in the normal mode. The 29th bit (FSQA) is related to the sequential monitoring of the switch current source group A in the normal mode. The 28th bit (FSQZ) is related to the sequential monitoring of the switch current source group Z in the normal mode. A value of the 27th to 25th bits (FITB2 to FITB0) is related to monitoring period setting of the switch current source group B in the normal mode. A value of the 24th to 22th bits (FITA2 to FITA0) is related to monitoring period setting in the normal mode of the switch current source group A. A value of the 21th to 19th bits (FITZ2 to FITZ0) is related to monitoring period setting of the switch current source group Z in the normal mode. A Value of the 18th bit (SVW1) and the 17th bit (SVW0) is related to strobe time setting. In the normal mode setting command of FIG. 10A, a value of the 16th to 8th bits is not related to operation of the vehicle switch control device and the switch state detection method in the embodiment of the present invention. A value of the 7th to 0th bits is related to the cyclic redundancy check CRC. The cyclic redundancy check CRC enables to determine an error in the communication data. The cyclic redundancy check CRC uses 32 bits, which is the sum of 8 bits of the 39th to 32th bits as the register address and 24 bits of the 31th to 8th bits as the setting data, so as to calculate 8 bits of the cyclic redundancy check CRC.

If the 31th bit (FSQ) of the setting data is 1, the all switch uniform sequential monitoring of FIG. 8 is enabled. If the 31th bit (FSQ) is 0, the all switch uniform sequential monitoring of FIG. 8 is disabled. If the 30th bit (FSQB) is 1, the sequential monitoring is enabled in which the switch current source group B sequentially outputs the monitoring signals INB0 to INB5. If the 30th bit (FSQB) is 0, the sequential monitoring is disabled. If the 29th bit (FSQA) is 1, the sequential monitoring is enabled in which the switch current source group A sequentially outputs the monitoring signals INA0 to INA7. If the 29th bit (FSQA) is 0, the sequential monitoring is disabled. If the 28th bit (FSQZ) is 1, the sequential monitoring is enabled in which the switch current source group Z sequentially outputs the monitoring signals INZ0 to INZ7. If the 28th bit (FSQZ) is 0, the sequential monitoring is disabled.

FIG. 10B is a diagram illustrating one example of a value related to setting of the monitoring period of the normal mode setting command of FIG. 10A.

First, the expression "FIT*[2:0](*:B,A,Z)[Default:000]" is described. The expression "FIT*[2:0](*:B,A,Z)" means that the normal mode monitoring period of each of the switch current source group B, the switch current source group A, and the switch current source group Z can be set by a value of the 27th bit (FITB2) to the 25th bit (FITB0), the 24th bit (FITA2) to the 22th bit (FITA0), or the 21th bit (FITZ2) to the 19th bit (FITZ0) (hereinafter referred to as FIT). The expression [Default:000] means that "000" is stored as each of the values of the 27th bit (FITB2) to the 25th bit (FITB0), the 24th bit (FITA2) to the 22th bit (FITA0), and the 21th bit (FITZ2) to the 19th bit (FITZ0) in initial setting.

If a value of FIT is "000", the constant monitoring operation is set. If a value of FIT is "001", the normal mode monitoring period is set to 2.5 msec. If a value of FIT is "010", the normal mode monitoring period is set to 5 msec. If a value of FIT is "011", the normal mode monitoring period is set to 10 msec. If a value of FIT is "100", the normal mode monitoring period is set to 20 msec. If a value of FIT is "101", the normal mode monitoring period is set to 30 msec. If a value of FIT is "110", the normal mode monitoring period is set to 40 msec. If a value of FIT is "111", the normal mode monitoring period is set to 50 msec.

FIG. 10C is a diagram illustrating one example of a value related to setting of the monitoring time of the normal mode setting command of FIG. 10A.

First, the expression "SVW*[1:0][Default:01]" is described. The expression "SVW*[1:0]" means that the strobe times of the switch current source group B, the switch current source group A, and the switch current source group Z can be set by values of the 18th bit (SVW1) and the 17th bit (SVW0) (hereinafter referred to as SVW). The expression [Default:01] means that "01" is stored as values of the 18th bit (SVW1) and the 17th bit (SVW0) in initial setting.

If a value of SVW is "00", the strobe time is set to 93.75 µsec. If a value of SVW is "01", the strobe time is set to 125 µsec. If a value of SVW is "10", the strobe time is set to 187.5 µsec. If a value of SVW is "11", the strobe time is set to 250 µsec.

Note that if the all switch uniform sequential monitoring and the sequential monitoring for each switch current source group are set at the same time, the all switch uniform sequential monitoring is given priority. In addition, if the sequential monitoring for each switch current source group and the constant monitoring are set, the constant monitoring is given priority.

FIG. 11A is a diagram illustrating one example of the sleep mode setting command in the embodiment of the present invention. Hereinafter, the sleep mode setting command of the vehicle switch control device and the switch state detection method in the embodiment of the present invention is described.

The sleep mode setting command illustrated in FIG. 11A is written in the EEPROM 51 of FIG. 1 by the user. The setting command includes the 8-bit register address, the 24-bit setting data, and the 8-bit cyclic redundancy check CRC. A value of the 39th to 32th bits of the setting command indicates the register address. A value of the 31th to 8th bits of the setting command indicates the setting data. A value of the 7th to 0th bits of the setting command indicates the cyclic redundancy check CRC. Value "0" of each bit corresponds to low level L of the signal, while value "1" corresponds to high level H of the signal. The bit assigned with "x" does not affect the operation. The register address of the setting command indicates an address of the register area in the internal register 42. In the example of FIG. 11A, "01001100" ("4C" in hexadecimal) is set as the register address. Hereinafter, in the internal register 42, the address area designated by the register address "01001100" is denoted by "SMR". The MPU 50 of FIG. 1 writes the setting data in the register area SMR in the internal register 42 designated by the register address of the setting command. In the vehicle switch control device and the switch state detection method in the embodiment of the present invention, the monitoring time value of the internal register 42 can set the monitoring period, the strobe time, and a type of the intermittent monitoring in the sleep mode.

A value of the 31th bit (SSQ) in the setting data is related to setting of the all switch uniform sequential monitoring in the sleep mode. A value of the 30th bit (SSQB) is related to the sequential monitoring of the switch current source group B in the sleep mode. A value of the 29th bit (SSQA) is related to the sequential monitoring of the switch current source group A in the sleep mode. A value of the 28th bit (SSQZ) is related to the sequential monitoring of the switch current source group Z in the sleep mode. A value of the 27th to 25th bits (SITB2 to SITB0) is related to the monitoring period setting of the switch current source group B in the sleep mode. A value of the 24th to 22th bits (SITA2 to SITA0) is related to the monitoring period setting of the switch current source group A in the sleep mode. A value of the 21th to 19th bits (SITZ2 to SITZ0) is related to the monitoring period setting of the switch current source group Z in the sleep mode. In the sleep mode setting command in FIG. 11A, a value of the 18th to 8th bits is not related to the operation of the vehicle switch control device and the switch state detection method in the embodiment of the present invention. The 7th to 0th bits are related to the cyclic redundancy check CRC. Using the cyclic redundancy check CRC, an error in the communication data can be determined. For the cyclic redundancy check CRC, 32 bits is used, which is the sum of the 8 bits of the 39th to 32th bits as the register address and 24 bits of the 31th to 8th bits as the setting data, and the 8 bits of the cyclic redundancy check CRC is calculated.

If the 31th bit (SSQ) in the setting data is 1, the all switch uniform sequential monitoring of FIG. 8 is enabled. If the 31th bit (SSQ) is 0, the all switch uniform sequential monitoring of FIG. 8 is disabled. If the 30th bit (SSQB) is 1, the sequential monitoring is enabled, in which the switch current source group B sequentially outputs the monitoring signals INB0 to INB5. If the 30th bit (SSQB) is 0, the sequential monitoring is disabled. If the 29th bit (SSQA) is 1, the sequential monitoring is enabled, in which the switch current source group A sequentially outputs the monitoring signals INA0 to INA7. If the 29th bit (SSQA) is 0, the sequential monitoring is disabled. If the 28th bit (SSQZ) is 1, the sequential monitoring is enabled, in which the switch current source group Z sequentially outputs the monitoring signals INZ0 to INZ7. If the 28th bit (FSQZ) is 0, the sequential monitoring is disabled.

FIG. 11B is a diagram illustrating one example of a value related to setting of the sleep mode monitoring period of the sleep mode setting command in FIG. 11A.

First, the expression "SIT*[2:0](*:B,A,Z)[Default:111]" is described. The expression "SIT*[2:0](*:B,A,Z)" means that the sleep mode monitoring period of each of the switch current source group B, the switch current source group A, and the switch current source group Z can be set by a value of the 27th bit (SITB2) to the 25th bit (SITB0), the 24th bit (SITA2) to the 22th bit (SITA0), or the 21th bit (SITZ2) to the 19th bit (SITZ0) (hereinafter referred to as SIT). The expression [Default:111] means that "111" is stored as each of the values of the 27th bit (SITB2) to the 25th bit (SITB0), the 24th bit (SITA2) to the 22th bit (SITA0), and the 21th bit (SITZ2) to the 19th bit (SITZ0) in initial setting.

If a value of SIT is "000", the constant monitoring operation is set. If a value of SIT is "001", the sleep mode monitoring period is set to 2.5 msec. If a value of SIT is "010", the sleep mode monitoring period is set to 5 msec. If a value of SIT is "011", the sleep mode monitoring period is set to 10 msec. If a value of SIT is "100", the sleep mode monitoring period is set to 20 msec. If a value of SIT is "101", the sleep mode monitoring period is set to 30 msec. If a value of SIT is "110", the sleep mode monitoring period is set to 40 msec. If a value of SIT is "111", the sleep mode monitoring period is set to 50 msec.

FIG. 12 is a flowchart illustrating a process content related to setting of the normal mode and setting of the sleep mode in embodiment of the present invention. Hereinafter, the flowchart of FIG. 12 is described with reference to FIGS. 1 and 12.

In FIG. 12, the MPU 50 first writes the setting data in the internal register 42 of the integrated circuit 41 (Step S101). In addition, the MPU 50 determines whether the vehicle engine is turned on or off (Step S102). In Step S103, if the vehicle engine is turned on as a result of the determination (N), the MPU 50 sends a signal to the integrated circuit 41 so that it operates in the normal mode (Step S104). In Step S105, if the 31th bit in the register area FMR of the internal register 42 is "1" (Y), the all switch uniform sequential monitoring is performed (Step S106). On the other hand, if the 31th bit in the register area FMR of the internal register 42 is "0" (N), monitoring of the switch current source group B (Step S107), monitoring of the switch current source group A (Step S108), and monitoring of the switch current source group Z (Step S109) are each performed. The integrated circuit 41 holds the monitoring result after monitoring in Steps S106 to S109 in the internal register 42 (Step S110).

In addition, in Step S103 for determining whether the vehicle engine is turned on or off, if the vehicle engine is turned off as a result of the determination (Y), the MPU 50 sends a signal to the integrated circuit 41 so that it operates in the sleep mode (Step S204). In Step S205, if the 31th bit in the register area SMR of the internal register 42 is "1" (Y), the all switch uniform sequential monitoring is performed (Step S206). On the other hand, in Step S205, if the 31th bit in the register area SMR of the internal register 42 is "0" (N), monitoring of the switch current source group B (Step S207), monitoring of the switch current source group A (Step S208), and monitoring of the switch current source group Z (Step S209) are each performed. The integrated circuit 41 holds the monitoring result after monitoring in Steps S206 to S209 in the internal register 42 (Step S110).

The MPU 50 regularly acquires the monitoring result in the internal register 42 (Step S111). In Step S112, if the head light switch 11, the door switch 12, or the window switch 13 is not in a predetermined state (N), the MPU 50 operates the various actuators 90 via the driver IC 60, the driver IC 62, and the like (Step S113). On the other hand, in Step S112, if the head light switch 11, the door switch 12, and the window switch 13 are in the predetermined state (Y), the MPU 50 stops the various actuators 90 via the IC 60, the driver IC 62, and the like (Step S114). When Step S113 or S114 is finished, the process returns to Step S102, in which the same operation is repeated. In this way, Steps S102 to S114 are related to the normal mode in which states of a plurality of switches are monitored at the set period.

Note that the MPU 50 may have a function of regularly monitoring the integrated circuit 41 and forces the integrated circuit 41 to switch from the sleep mode to the normal mode when the switch state is changed. In addition, instead of the MPU 50, the integrated circuit 41 may have a function of automatically switching from the sleep mode to the normal mode when the switch state is changed. In addition, in Step S110 of FIG. 12, when the monitoring result stored in the internal register 42 indicates that the switch state is changed, the MPU 50 may be changed from a sleep state to a normal state by an interrupt operation. Further, as to Step S101, the MPU 50 may use the timer so as to regularly write the setting data in the internal register 42 of the integrated circuit 41. In this way, the setting data stored in the internal register 42 can be prevented from being erased.

Figure 12A:
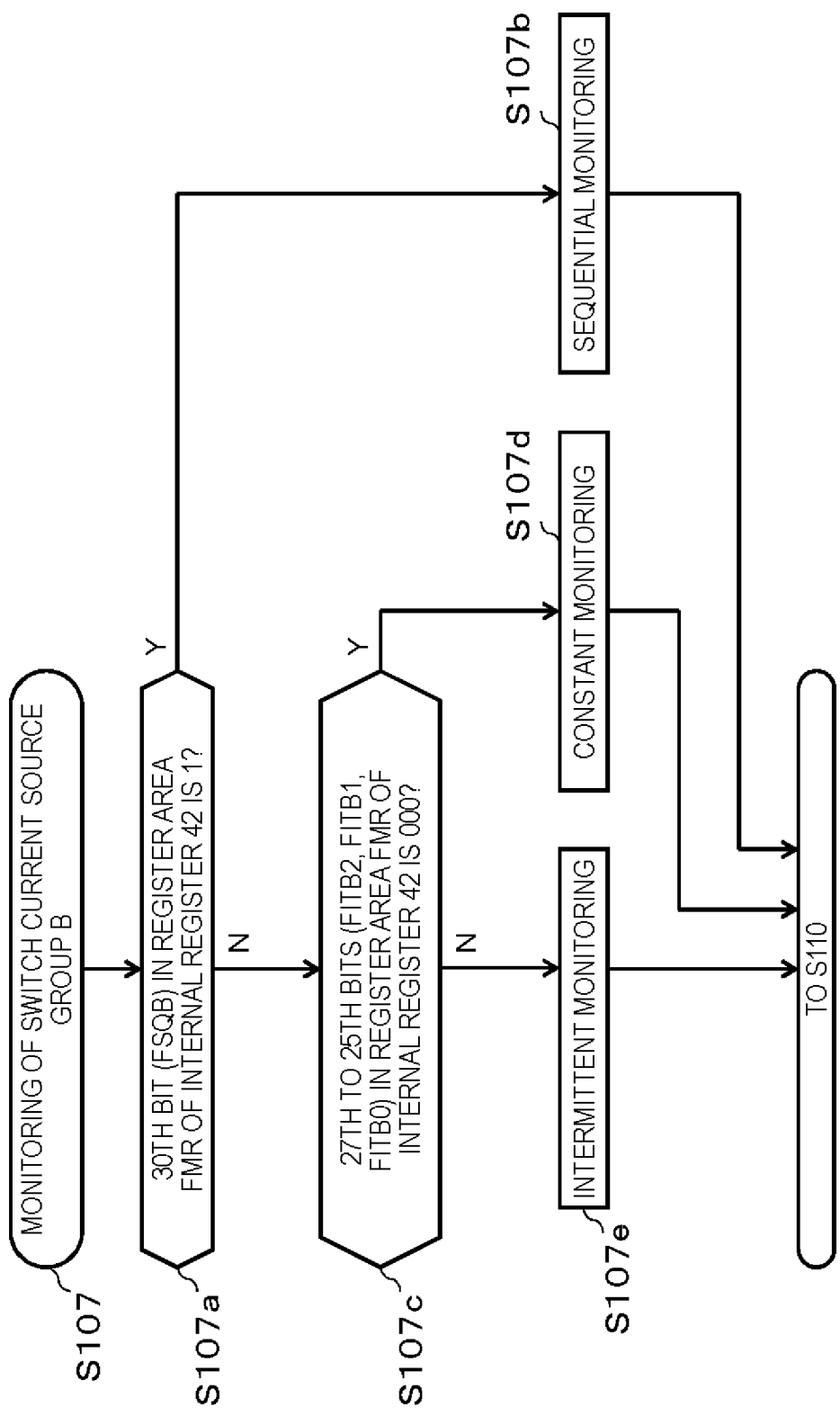
FIG. 12A is a flowchart illustrating a determination process of Step S104 in the normal mode in the embodiment of the present invention.

FIG. 12A is a flowchart illustrating the determination process of Step S107 in the normal mode in the embodiment of the present invention of FIG. 12. Hereinafter, the flowchart of FIG. 12A is described with reference to FIGS. 6 to 8, 10A, 10B, and 12.

In the determination process of the 30th bit (FSQB) in the register area FMR of the internal register 42 (Step S107), a value of the 30th bit (FSQB) is determined (Step S107a). If a value of the 30th bit (FSQB) is "1" (Y), the switch current sources B0 to B5 perform the sequential monitoring in which the monitoring signals INB0 to INB5 are sequentially output (Step S107b). On the other hand, if a value of the 30th bit (FSQB) is "0" (N), the process proceeds to Step S107c. If each of the values of the 27th to 25th bits (FITB2 to FITB0) is "0" (Y), the constant monitoring is performed in which the switch current sources B0 to B5 always continuously output the monitoring signals INB0 to INB5 (Step S107d). On the other hand, if one of the values of the 27th to 25th bits (FITB2 to FITB0) is "1" (N), the intermittent monitoring is performed in which the switch current sources B0 to B5 intermittently output the monitoring signals INB0 to INB5 (Step S107e). After the intermittent monitoring (Step S107e), the constant monitoring (Step S107d), or the sequential monitoring (Step S107b), the process proceeds to Step S110 illustrated in FIG. 12.

Figure 12B:
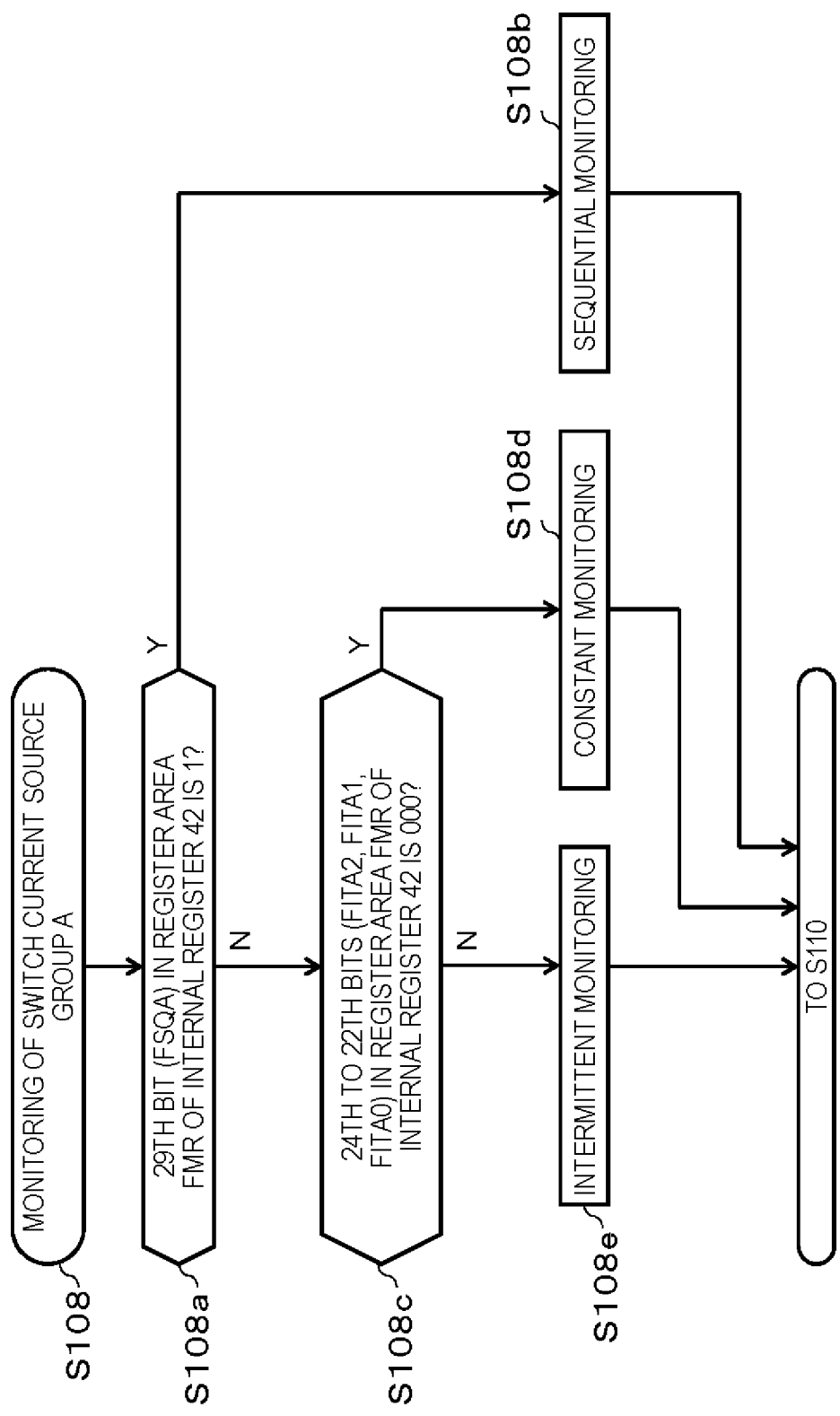
FIG. 12B is a flowchart illustrating a determination process of Step S105 in the normal mode in the embodiment of the present invention.

FIG. 12B is a flowchart illustrating the determination process of Step S108 in the normal mode in the embodiment of the present invention of FIG. 12. Hereinafter, the flowchart of FIG. 12B is described with reference to FIGS. 6 to 8, 10A, 10B, and 12.

In the determination process of the 29th bit (FSQA) in the register area FMR of the internal register 42 (Step S108), a value of the 29th bit (FSQA) is determined (Step S108a). If a value of the 29th bit (FSQA) is "1" (Y), the sequential monitoring is performed, in which the switch current sources A0 to A7 sequentially output the monitoring signals INA0 to INA7 (Step S108b). On the other hand, if a value of the 29th bit (FSQA) is "0" (N), the process proceeds to Step S108c. If each of the values of the 24th to 22th bits (FITA2 to FITA0) is "0" (Y), the constant monitoring is performed, in which the switch current sources A0 to A7 always continuously output the monitoring signals INA0 to INA7 (Step S108d). On the other hand, if one of the values of 24th to 22th bits (FITA2 to FITA0) is "1" (N), the intermittent monitoring is performed, in which the switch current sources A0 to A7 intermittently output the monitoring signals INA0 to INA7 (Step S108e). After the intermittent monitoring (Step S108e), the constant monitoring (Step S108d), or the sequential monitoring (Step S108b), the process proceeds to Step S110 illustrated in FIG. 12.

Figure 12C:
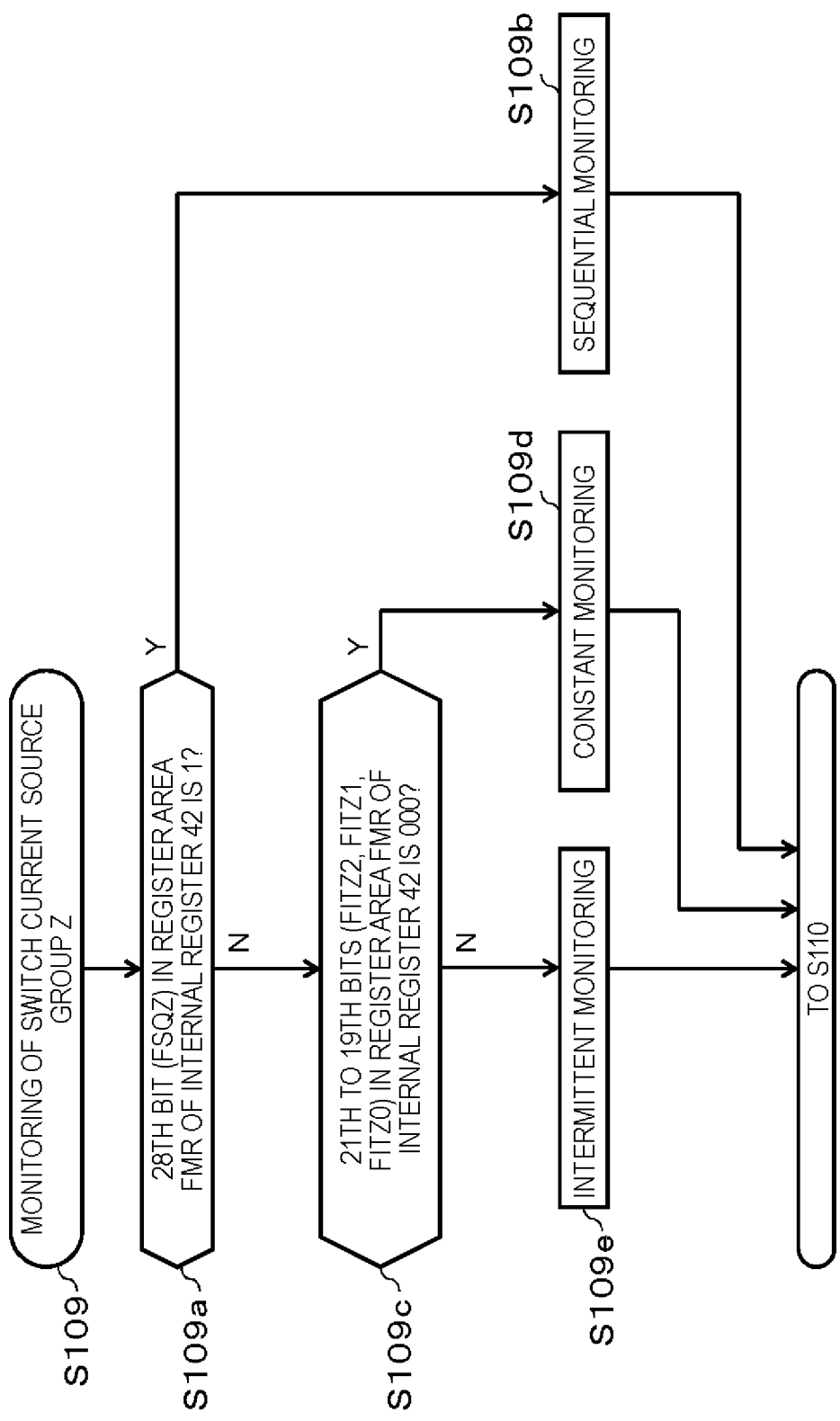
FIG. 12C is a flowchart illustrating a determination process of Step S106 in the normal mode in the embodiment of the present invention.

FIG. 12C is a flowchart illustrating the determination process of Step S109 in the normal mode in the embodiment of the present invention of FIG. 12. Hereinafter, the flowchart of FIG. 12C is described with reference to FIGS. 6 to 8, 10A, 10B, and 12.

In the determination process of the 28th bit (FSQZ) in the register area FMR of the internal register 42 (Step S109), a value of the 28th bit (FSQZ) is determined (Step S109a). If a value of the 28th bit (FSQZ) is "1" (Y), the sequential monitoring is performed in which the switch current sources Z0 to Z7 sequentially output the monitoring signals INZ0 to INZ7 (Step S109b). On the other hand, if a value of the 28th bit (FSQZ) is "0" (N), the process proceeds to Step S109c. If each of the values of the 21th to 19th bits (FITZ2 to FIT0) is "0" (Y), the constant monitoring is performed in which the switch current sources Z0 to Z7 always continuously output the monitoring signals INZ0 to INZ7 (Step S109d). On the other hand, if one of the values of the 21th to 19th bits (FITZ2 to FIT0) is "1" (N), the intermittent monitoring is performed in which the switch current sources Z0 to Z7 intermittently output the monitoring signals INZ0 to INZ7 (Step S109e). After the intermittent monitoring (Step S109e), the constant monitoring (Step S109d), or the sequential monitoring (Step S109b), the process proceeds to Step S110 illustrated in FIG. 12.

Figure 12D:
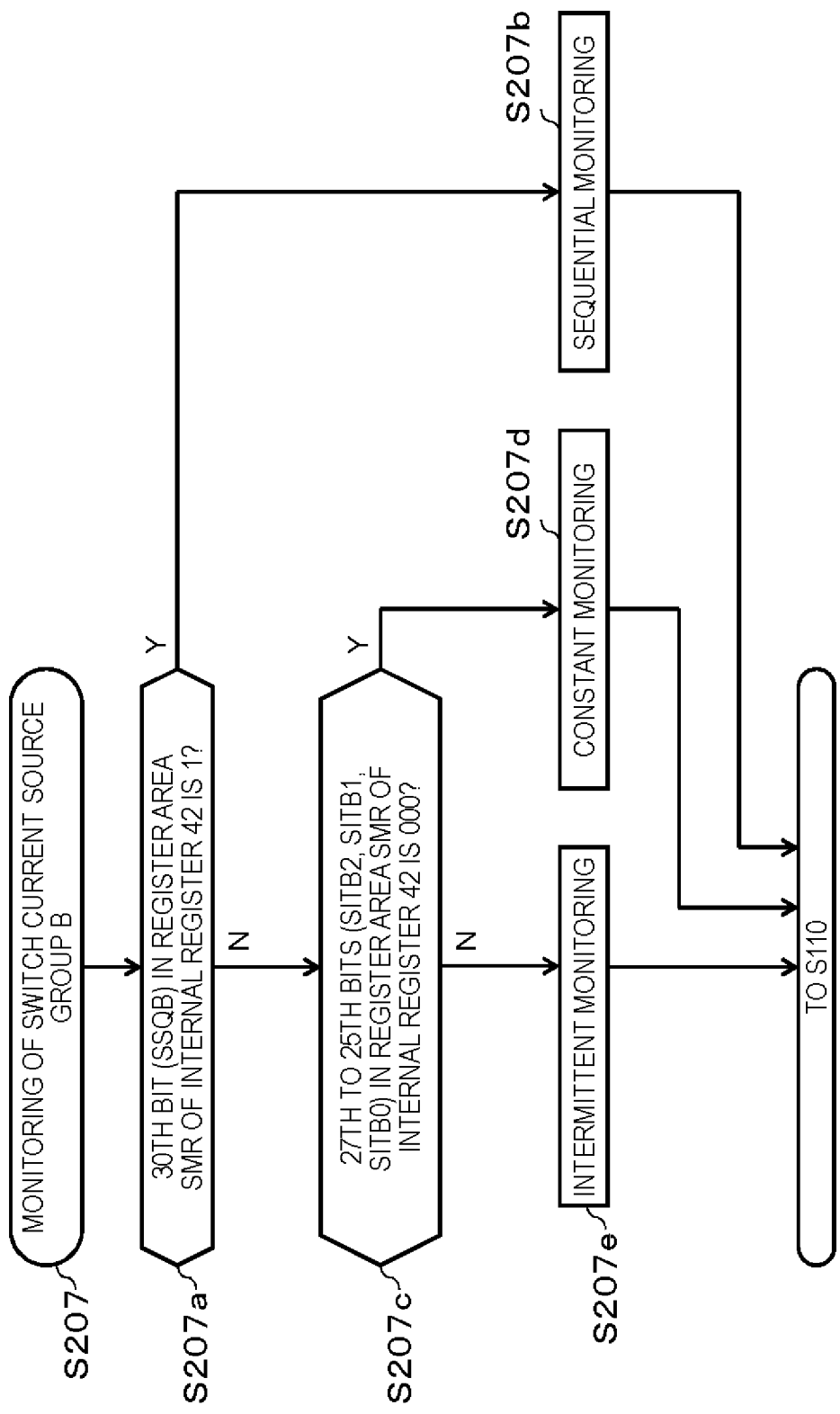
FIG. 12D is a flowchart illustrating a determination process of Step S204 in the sleep mode in the embodiment of the present invention.

FIG. 12D is a flowchart illustrating the determination process of Step S207 in the sleep mode in the embodiment of the present invention of FIG. 12. Hereinafter, the flowchart of FIG. 12D is described with reference to FIGS. 6 to 8, 11A, 11B, and 12.

In the determination process of the 30th bit (SSQB) in the register area SMR of the internal register 42 (Step S207), a value of the 30th bit (SSQB) is determined (Step S207a). If a value of the 30th bit (SSQB) is "1" (Y), the sequential monitoring is performed in which the switch current sources B0 to B5 sequentially output the monitoring signals INB0 to INB5 (Step S207b). On the other hand, if a value of the 30th bit (SSQB) is "0" (N), the process proceeds to Step S207c. If each of the values of the 27th to 25th bits (SITB2 to SITB0) is "0" (Y), the constant monitoring is performed, in which the switch current sources B0 to B5 always continuously output the monitoring signals INB0 to INB5 (Step S207d). On the other hand, if one of the values of the 27th to 25th bits (SITB2 to SITB0) is "1" (N), the intermittent monitoring is performed in which the switch current sources B0 to B5 intermittently output the monitoring signals INB0 to INB5 (Step S207e). After the intermittent monitoring (Step S207e), the constant monitoring (Step S207d), or the sequential monitoring (Step S207b), the process proceeds to Step S110 illustrated in FIG. 12.

Figure 12E:
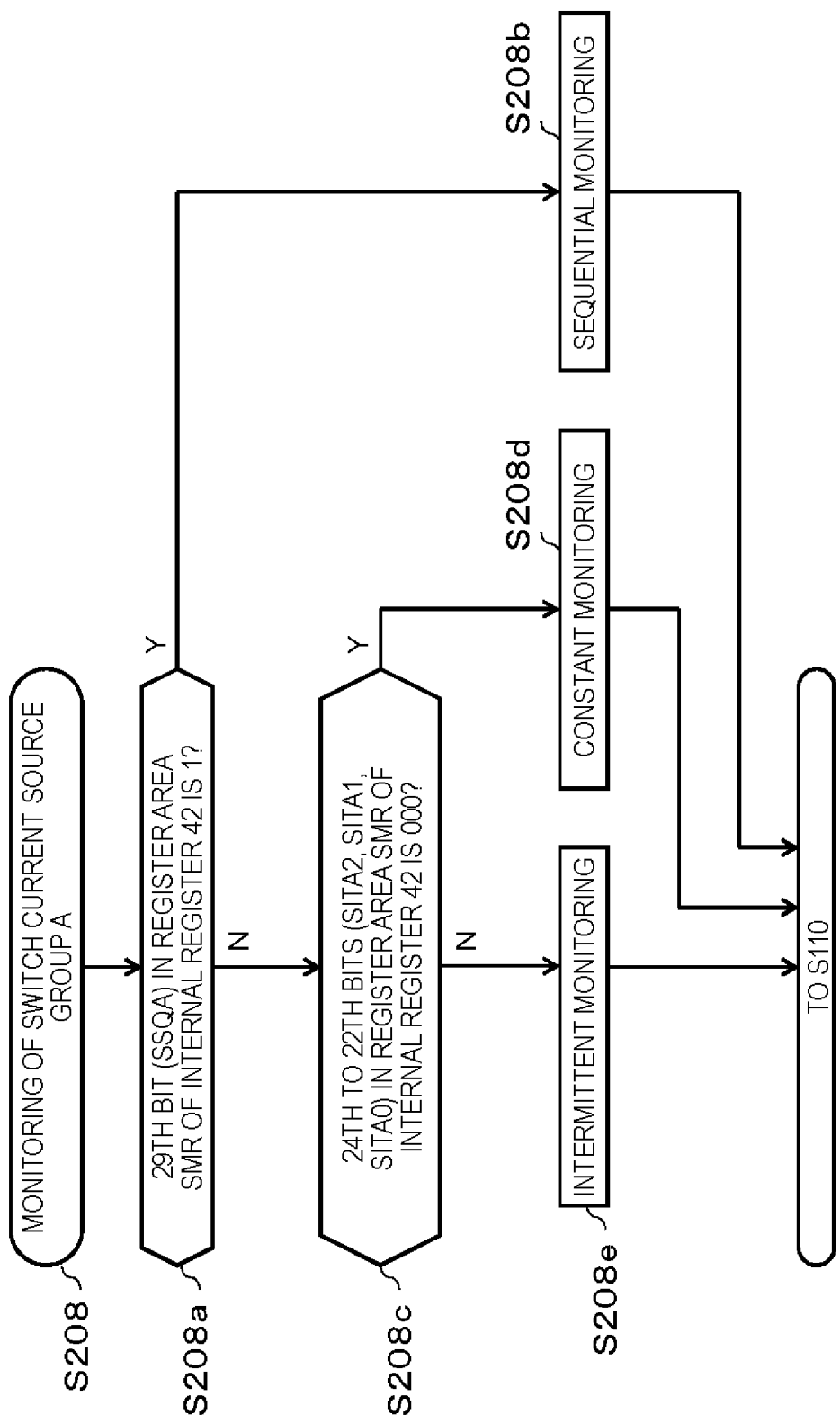
FIG. 12E is a flowchart illustrating a determination process of Step S205 in the sleep mode in the embodiment of the present invention.

FIG. 12E is a flowchart illustrating the determination process of Step S208 in the sleep mode in the embodiment of the present invention of FIG. 12. Hereinafter, the flowchart of FIG. 12E is described with reference to FIGS. 6 to 8, 11A, 11B, and 12.

In the determination process of the 29th bit (SSQA) in the register area SMR of the internal register 42 (Step S208), a value of the 29th bit (SSQA) is determined (Step S208a). If a value of the 29th bit (SSQA) is "1" (Y), the sequential monitoring is performed in which the switch current sources A0 to A7 sequentially output the monitoring signals INA0 to INA7 (Step S208b). On the other hand, if a value of the 29th bit (SSQA) is "0" (N), the process proceeds to Step S208c. If each of the values of the 24th to 22th bits (SITA2 to SITA0) is "0" (Y), the constant monitoring is performed in which the switch current sources A0 to A7 always continuously output the monitoring signals INA0 to INA7 (Step S208d). On the other hand, if one of the values of the 24th to 22th bits (SITA2 to SITA0) is "1" (N), the intermittent monitoring is performed in which the switch current sources A0 to A7 intermittently output the monitoring signals INA0 to INA7 (Step S208e). After the intermittent monitoring (Step S208e), the constant monitoring (Step S208d), or the sequential monitoring (Step S208b), the process proceeds to Step S110 illustrated in FIG. 12.

Figure 12F:
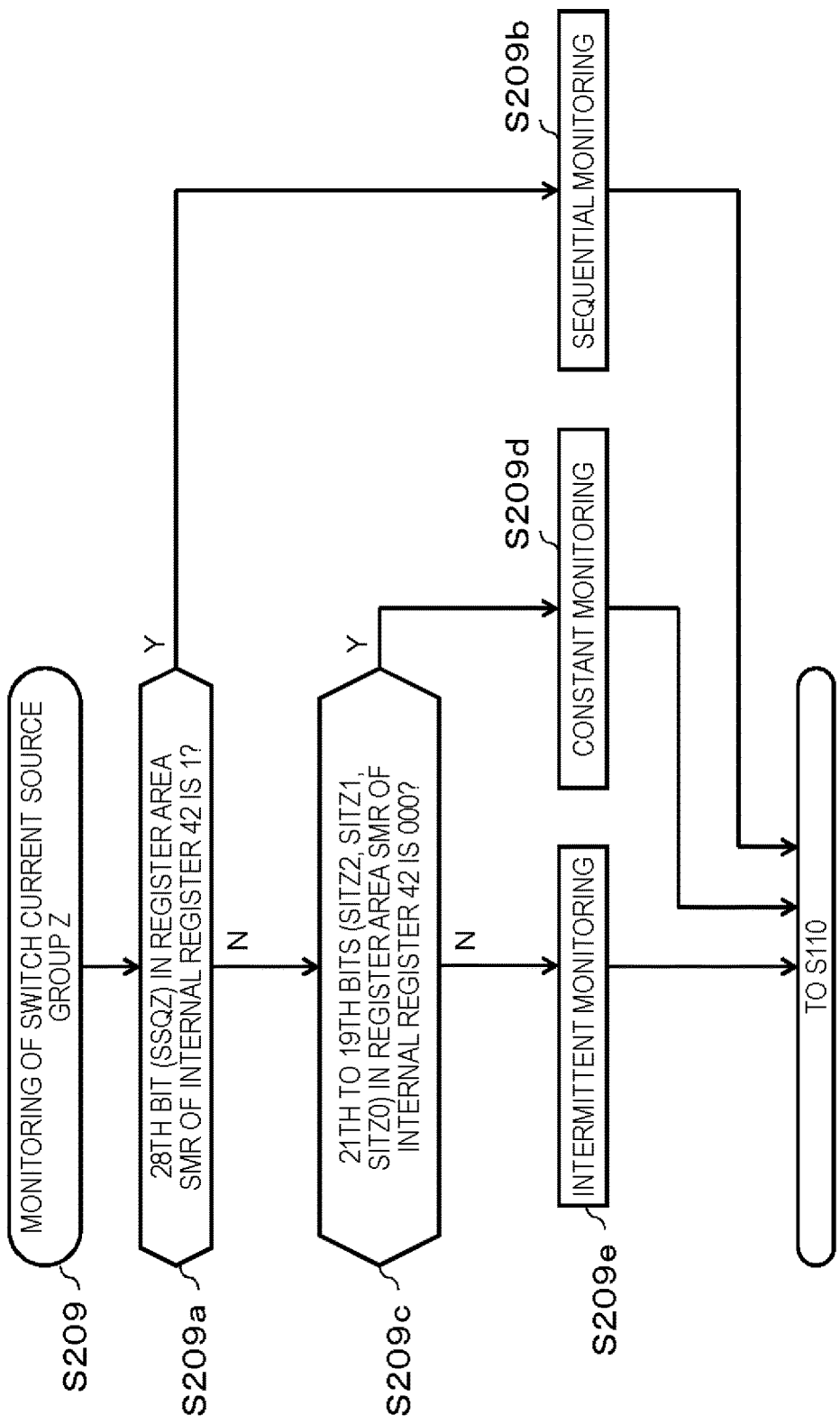
FIG. 12F is a flowchart illustrating a determination process of Step S206 in the sleep mode in the embodiment of the present invention.
Figure 13:
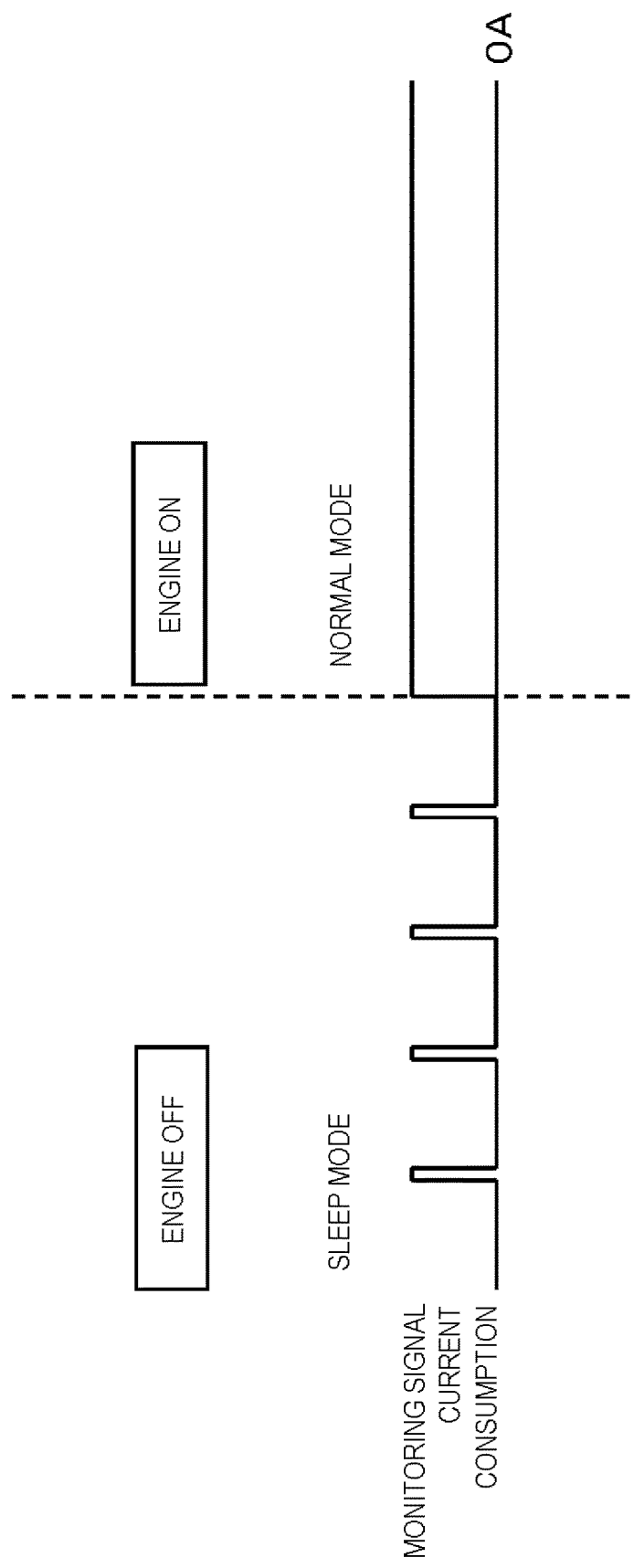
FIG. 13 is a diagram illustrating current consumption of a conventional switch detection circuit when an engine is turned on and off.

FIG. 12F is a flowchart illustrating the determination process of Step S209 in the sleep mode in the embodiment of the present invention of FIG. 12. Hereinafter, the flowchart of FIG. 12F is described with reference to FIGS. 6 to 8, 11A, 11B, and 12.

In the determination process of the 28th bit (SSQZ) in the register area SMR of the internal register 42 (Step S209), a value of the 28th bit (SSQZ) is determined (Step S209a). If a value of the 28th bit (SSQZ) is "1" (Y), the sequential monitoring is performed in which the switch current sources Z0 to Z7 sequentially output the monitoring signals INZ0 to INZ7 (Step S209b). On the other hand, if a value of the 28th bit (SSQZ) is "0" (N), the process proceeds to Step S209c. If each of the values of the 21th to 19th bits (SITZ2 to SITZ0) is "0" (Y), the constant monitoring is performed in which the switch current sources Z0 to Z7 always continuously output the monitoring signals INZ0 to INZ7 (Step S209d). On the other hand, if one of the values of the 21th to 19th bits (SITZ2 to SITZ0) is "1" (N), the intermittent monitoring is performed in which the switch current sources Z0 to Z7 intermittently output the monitoring signals INZ0 to INZ7 (Step S209e). After the intermittent monitoring (Step S209e), the constant monitoring (Step S209d), or the sequential monitoring (Step S209b), the process proceeds to Step S110 illustrated in FIG. 12.

As described above, in the vehicle switch control device and the switch state detection method in the embodiment of the present invention, the monitoring period of the switch and the sequential monitoring can be set individually for each of the normal mode and the sleep mode. In other words, the monitoring period of the switch and the sequential monitoring operation can be set individually for each of the case where the vehicle engine is turned on and the case where the vehicle engine is turned off. Therefore, power consumption can be largely reduced.

In addition, a required frequency of monitoring is different depending on a type of the switch such as the head light switch 11, the door switch 12, or the window switch 13. In the vehicle switch control device and the switch state detection method of the present invention, the frequency of monitoring can be set according to a type of the switch. Therefore, power consumption can be reduced. In addition, by appropriately setting the monitoring period and the strobe time of the switch, the switch can be securely monitored. Note that the MPU 50 as a computer executes the steps related to setting of the normal mode and setting of the sleep mode in the embodiment of the present invention described above with reference to FIGS. 12 and 12A to 12F. In this way, states of the plurality of switches are monitored.

INDUSTRIAL APPLICABILITY

The present invention can be used for in-vehicle devices or industrial devices. Therefore, the present invention has high industrial applicability.

LIST OF REFERENCE SIGNS

1 ECU
11 head light switch
12 door switch
13 window switch
21 to 23 wire harness
31 to 33 terminal
40 switch state detection circuit 41 integrated circuit
42 internal register
50 MPU
51 EEPROM
52 LIN
60, 61 driver IC
70 other circuits
80 various ECUs
90 various actuators
110 to 117 switch
A, B, Z switch current source group
A0 to A7, B0 to B5, Z0 to Z7 switch current source
INA0 to INA7, INB0 to INB5, INZ0 to INZ7 monitoring signal
Sca0 to Sca7, Scb0 to Scb5, Scz0 to Scz7 control signal
Vcc power supply voltage
Vbat battery voltage
Vst, Vst1 reference strobe signal

The invention claimed is:

1. A switch state detection circuit arranged to detect states of a plurality of switches in a vehicle including an engine, the detection circuit comprising:
   a plurality of switch current sources corresponding to the plurality of switches, respectively; and
   an integrated circuit arranged to determine an on/off state of the engine, to operate in a normal mode in which the plurality of switch current sources are intermittently turned on so that the states of the plurality of switches are detected at a first period when the engine is determined to be turned on, and to operate in a sleep mode in which the plurality of switch current sources are intermittently turned on so that the states of the plurality of switches are detected at a second period when the engine is determined to be turned off.

2. The switch state detection circuit according to claim 1, wherein the second period is longer than the first period.

3. The switch state detection circuit according to claim 1 or 2, wherein
   the plurality of switch current sources are divided into a plurality of switch current source groups, and
   the integrated circuit performs sequential operation in which the plurality of switch current sources in each switch current source group are sequentially turned on.

4. The switch state detection circuit according to claim 1 or 2, wherein the integrated circuit performs all switch uniform sequential operation in which the plurality of switch current sources are sequentially turned on.

5. The switch state detection circuit according to claim 1, wherein
   the integrated circuit further includes a storage device in which information indicating the first and second periods can be written externally, and
   the integrated circuit detects the states of the plurality of switches in the normal mode at the first period based on the information stored in the storage device, and detects the states of the plurality of switches in the sleep mode at the second period based on the information stored in the storage device.

6. A switch state detection method for detecting states of a plurality of switches in a vehicle including an engine, the method comprising the steps of:
   determining an on/off state of the engine;
   detecting the states of the plurality of switches at a first period by supplying currents from a plurality of switch current sources to the plurality of switches when the engine is determined to be turned on; and
   detecting the states of the plurality of switches at a second period by supplying currents from the plurality of switch current sources to the plurality of switches when the engine is determined to be turned off.

7. The switch state detection method according to claim 6, wherein the second period is longer than the first period.

8. The switch state detection method according to claim 6, wherein the plurality of switch current sources are divided into a plurality of switch current source groups, and the method further comprising the steps of:
   determining whether or not to perform a sequential operation in which the plurality of switch current sources of the plurality of switch current source groups are sequentially turned on in the normal mode and in the sleep mode; and
   sequentially detecting the states of the plurality of switches at the first period or the second period, by sequentially turning on the plurality of switch current sources of the plurality of switch current source groups, so as to sequentially supply currents from the current sources to the plurality of switches, when it is determined to perform the sequential operation.

9. The switch state detection method according to claim 6, further comprising the steps of:
   determining whether or not to perform an all switch uniform sequential operation in which the plurality of switch current sources are sequentially turned on in a normal mode and in a sleep mode; and
   sequentially detecting the states of the plurality of switches at the first period or the second period, by sequentially turning on the plurality of switch current sources, so as to sequentially supply currents from the plurality of switch current sources to the plurality of switches, when it is determined to perform the all switch uniform sequential operation.

10. A computer program for causing a computer to perform the steps according to claim 6.

* * * * *